US010490271B2

(12) United States Patent
Ogiwara et al.

(10) Patent No.: US 10,490,271 B2
(45) Date of Patent: Nov. 26, 2019

(54) RESISTANCE CHANGE MEMORY DEVICE

(71) Applicant: Toshiba Memory Corporation, Minato-ku (JP)

(72) Inventors: Ryu Ogiwara, Yokohama (JP); Daisaburo Takashima, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/915,620

(22) Filed: Mar. 8, 2018

(65) Prior Publication Data
US 2019/0088319 A1 Mar. 21, 2019

(30) Foreign Application Priority Data
Sep. 20, 2017 (JP) ................................ 2017-180632

(51) Int. Cl.
*G11C 13/00* (2006.01)
*G11C 11/56* (2006.01)

(52) U.S. Cl.
CPC ........ *G11C 13/004* (2013.01); *G11C 11/5614* (2013.01); *G11C 11/5678* (2013.01); *G11C 11/5685* (2013.01); *G11C 13/0026* (2013.01); *G11C 13/0028* (2013.01); *G11C 2013/005* (2013.01); *G11C 2013/0042* (2013.01); *G11C 2013/0052* (2013.01); *G11C 2013/0054* (2013.01); *G11C 2211/563* (2013.01)

(58) Field of Classification Search
CPC ................ G11C 2013/0054; G11C 2013/0045
USPC ........................................................ 365/148
See application file for complete search history.

(56) References Cited

U.S. PATENT DOCUMENTS

| 7,548,467 | B2 * | 6/2009 | Kim ...................... G11C 5/147 |
| | | | 365/148 |
| 7,800,935 | B2 | 9/2010 | Maejima et al. |
| 7,940,552 | B2 | 5/2011 | Chang-Wook et al. |
| 8,081,501 | B2 * | 12/2011 | Choi ....................... G11C 8/10 |
| | | | 365/148 |
| 9,093,144 | B2 | 7/2015 | Kanno et al. |
| 9,196,358 | B2 * | 11/2015 | Lee ..................... G11C 13/004 |
| 9,536,605 | B2 * | 1/2017 | Park .................... G11C 11/1673 |

FOREIGN PATENT DOCUMENTS

| JP | 2009-099206 | 5/2009 |
| JP | 2014-146406 | 8/2014 |

OTHER PUBLICATIONS

Sebastian, A., et al., "Non-resistance-based cell-state metric for phase-change memory", Journal of Applied Physics, vol. 110, 2011, pp. 084505-1-084505-6 with cover page.

(Continued)

*Primary Examiner* — Son L Mai
(74) *Attorney, Agent, or Firm* — Oblon, McClelland, Maier & Neustadt, L.L.P.

(57) ABSTRACT

According to one embodiment, a resistance change memory device comprises a memory cell array in which a plurality of resistance change storage elements each to store one of multiple resistance states as data represented in two or more bits are arranged, and a read unit to read the data of a selected one of the storage elements. In reading the data of the storage element, the read unit, selecting one at a time, applies multiple types of constant voltages to the storage element.

18 Claims, 27 Drawing Sheets

(56) References Cited

OTHER PUBLICATIONS

Papandreou, N., et al., "Drift-Resilient Cell-State Metric for Multilevel Phase-Change Memory", IEEE, 2011, pp. IEDM11-55-58.
Stanisavljevic, M., et al., "Phase-Change Memory: Feasibility of Reliable Multilevel-cell Storage and Retention at Elevated Temperatures", IEEE, 2015, pp. 5B.6.1-5B.6.6.

* cited by examiner

RESISTANCE CHANGE MEMORY DEVICE

CROSS-REFERENCE TO RELATED APPLICATIONS

This application is based upon and claims the benefit of priority from Japanese Patent Application No. 2017-180632, filed on Sep. 20, 2017; the entire contents of which are incorporated herein by reference.

FIELD

Embodiments described herein relate generally to a resistance change memory device.

BACKGROUND

Conventionally, memory devices including resistance change storage elements each to store one of a plurality of, typically four or more, resistance states as data represented in two or more bits (multi-valued data) are known. For example, in reading data in these memory devices, the sensing operation of comparing the voltage when reading after applying a predetermined voltage (read voltage) to a bit line connected to a selected storage element and a reference voltage corresponding to one of a plurality of threshold resistances is repeated while changing the reference voltage so as to identify the resistance state of that storage element.

SUMMARY

Technical Problem

The resistance change storage element to store multi-valued data (two or more bits of data) may be set to be in a high resistance state, in which case the read may be slow. Accordingly, one can think of reading at an operation point of a high current and high voltage, but a false write or the like may occur at the operation point of a high current and high voltage, so that the data may be destroyed.

Solution to Problem

According to one embodiment, a resistance change memory device comprises a memory cell array in which a plurality of resistance change storage elements each to store one of multiple resistance states as data represented in two or more bits are arranged, and a read unit to read the data of a selected one of the storage elements. In reading the data of the storage element, the read unit, selecting one at a time, applies multiple types of constant voltages to the storage element.

DETAILED DESCRIPTION

Embodiments of a resistance change memory device will be described in detail below with reference to the accompanying drawings.

Figure 1:
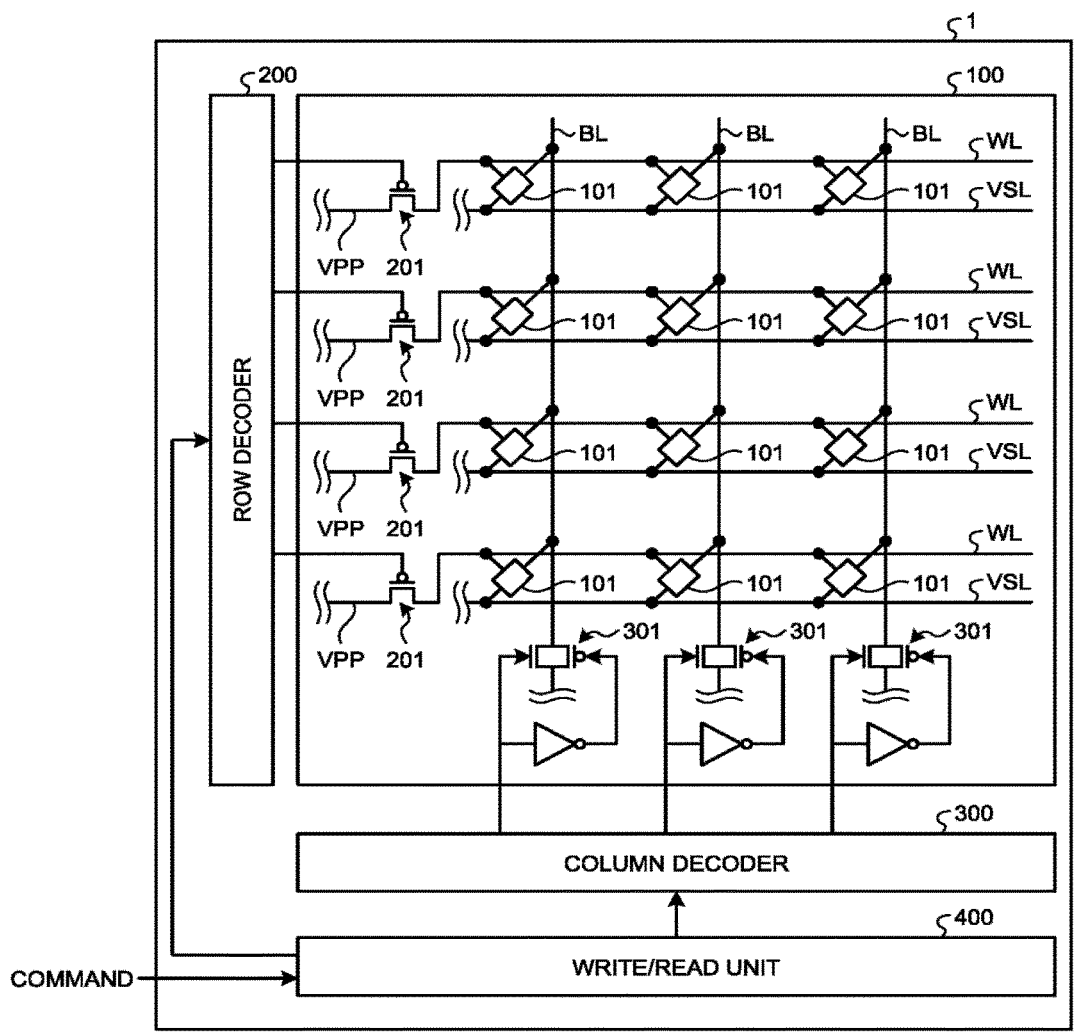
FIG. 1 is a diagram schematically illustrating the configuration of a resistance change memory device of a first embodiment.

FIG. 1 is a block diagram schematically illustrating the configuration of a resistance change memory device 1 common to the embodiments below. The resistance change memory device 1 comprises a memory cell array 100, a row decoder 200, a column decoder 300, and a write/read unit 400 as shown in FIG. 1.

Figure 2:
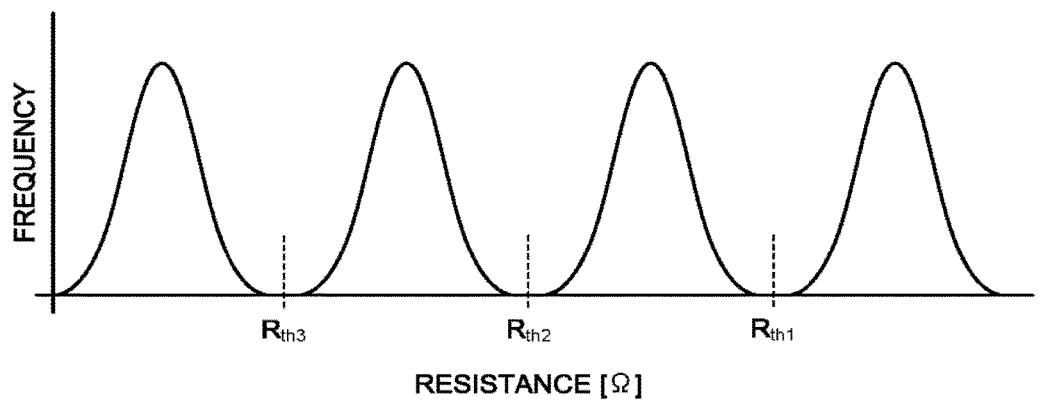
FIG. 2 is a graph for explaining threshold resistances of the first embodiment.

In the memory cell array 100, a plurality of resistance change storage elements 101 each to store one of a plurality of resistance states as data represented in two or more bits (multi-valued data) are arranged. More specifically, in the memory cell array 100, a plurality of storage elements 101 are arranged in a matrix. As shown in FIG. 1, the storage elements 101 are placed at the intersections of multiple word lines WL and multiple bit lines BL. Although in this example the resistance change storage element 101 can be set to be in four resistance states depending on the write voltage, the number of resistance states available for setting is not limited to this. This description is based on the premise that the storage element 101 is to store one of four resistance states as data (two bits of data). In the description below, the four resistance states are respectively denoted as (1, 1), (1, 0), (0, 1), (0, 0) in the order of from high resistance. In reading the data of the storage element 101, it is necessary to determine which of the four resistance states the resistance state of the storage element 101 is. Accordingly, herein, three threshold resistances ($R_{th1} > R_{th2} > R_{th3}$) are provided to recognize the four resistance states as shown in FIG. 2.

As the resistance change storage element 101, for example, alloy-type PCM, interface-type PCM (iPCM), ReRAM, (HfOx), CBRAM (Cu/Al$_2$O$_3$), or the like can be used.

The row decoder 200 selects a word line WL based on an address signal sent from the write/read unit 400. In the example of FIG. 1, for each word line WL, there is provided a selection transistor 201 to switch between conduction and non-conduction between the word line WL and a power supply line VPP (a power supply for raising the voltage on the word line WL). The row decoder 200 turns a selection transistor 201 on and keeps non-selected selection transistors 201 off. In this example, the selection transistor 201 switches on/off according to the signal supplied to its gate, and if the signal is high, the selection transistor 201 transitions to an OFF state, and if the signal is low, the selection transistor 201 transitions to an ON state.

The column decoder 300 selects a bit line BL based on an address signal sent from the write/read unit 400. In the example of FIG. 1, for each bit line BL, there is provided a selection transistor 301 to switch between conduction and non-conduction between the bit line BL and a constant voltage supply unit described later (typically a high potential power supply line (not shown); VRV1, VRV2H, or Vdd described later is used in the embodiments; Imax is supplied in the case of a current source). The column decoder 300 causes the selection transistor 301 provided on a selected bit line BL to transition to the ON state and keeps the selection transistors 301 provided on non-selected bit lines BL in the OFF state.

The write/read unit 400 accepts a command from an external host device (a write command to request a data write or a read command to request a data read) and writes or reads data according to the accepted command. For example, the read command includes an address signal to identify the location of the storage element 101 to read from, and the write/read unit 400 controls the row decoder 200 and the column decoder 300 to select the storage element 101 to read front, designated by the address signal.

The function for data read of the write/read unit 400 corresponds to a read unit for reading the data of a selected storage element 101. Hereinafter, the write/read unit 400 is called the read unit 400, and description will be made focusing on the function for data read.

Figure 3:
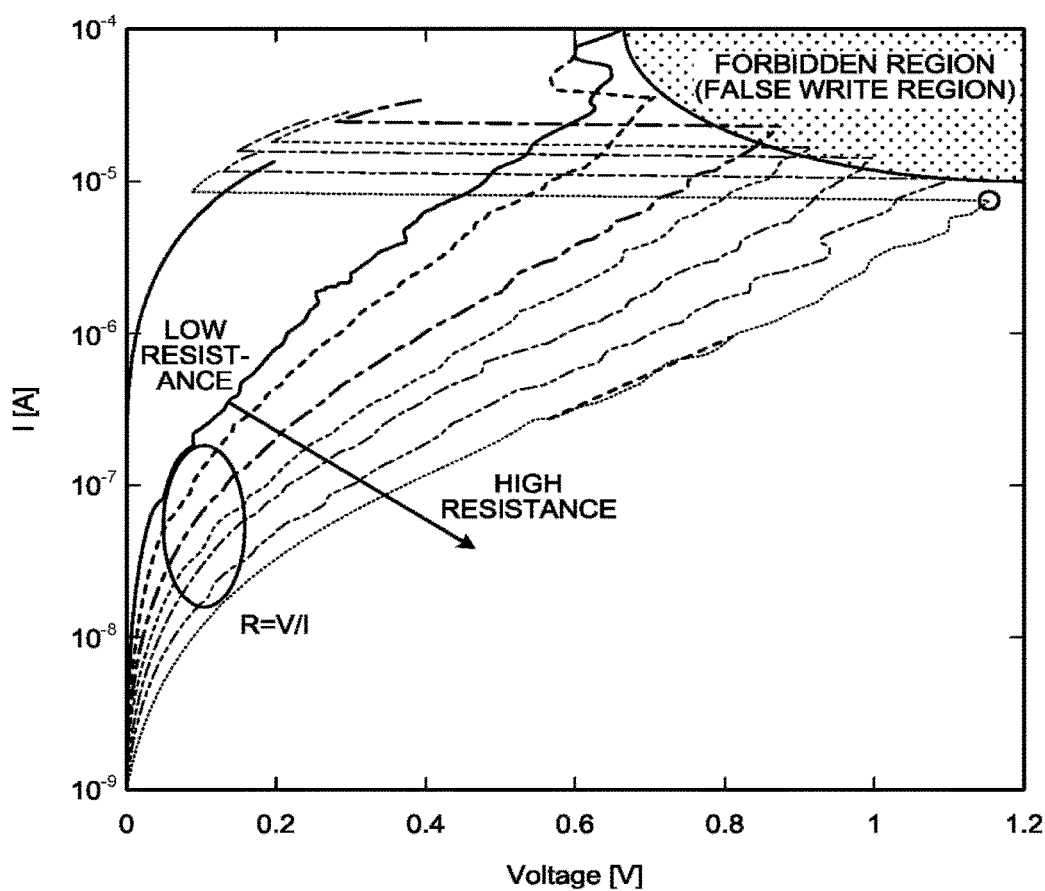
FIG. 3 is a graph illustrating the current-voltage characteristic of a storage element of the first embodiment.

In reading multi-valued data, because read speed in reading the data of the high resistance state is slow, in order to make the speed faster, it is desirable to read from the storage element 101 at an operation point of as high a current and as high a voltage as possible. FIG. 3 is a graph illustrating the current-voltage characteristic of the storage element 101, and a phase transition occurs in the storage element 101 at operation points of a high current and high voltage, so that the resistance state changes abruptly causing a false write or the like, and thus the data may be destroyed. Hence, it is desirable to read at an operation point of a high current and high voltage, avoiding the forbidden region that is a set of phase transition points indicating operation points at which a phase transition occurs in the storage element 101.

Accordingly, in reading the data of the storage element 101, the read unit 400 of the embodiments, selecting one at a time, applies multiple types of constant voltages to the storage element 101. More specifically, the read unit 400 selects a constant voltage so as to read avoiding the forbidden region that is a set of phase transition points indicating operation points at which a phase transition occurs in the storage element 101. A specific description will be made below.

First Embodiment

The read unit 400 sequentially selects multiple reference voltages corresponding to multiple (here three) threshold resistances ($R_{th1}$, $R_{th2}$, $R_{th3}$) to determine which of multiple resistance states the data of a storage element 101 selected to be read from is. The read unit 400 selects the next reference voltage and the next constant voltage to read, according to the result of comparing a first reference voltage VREF1 that is the reference voltage selected first and the voltage when reading after applying a first constant voltage VRV1 that is the constant voltage selected first to the bit line BL for supplying a voltage to the storage element 101.

Figure 4:
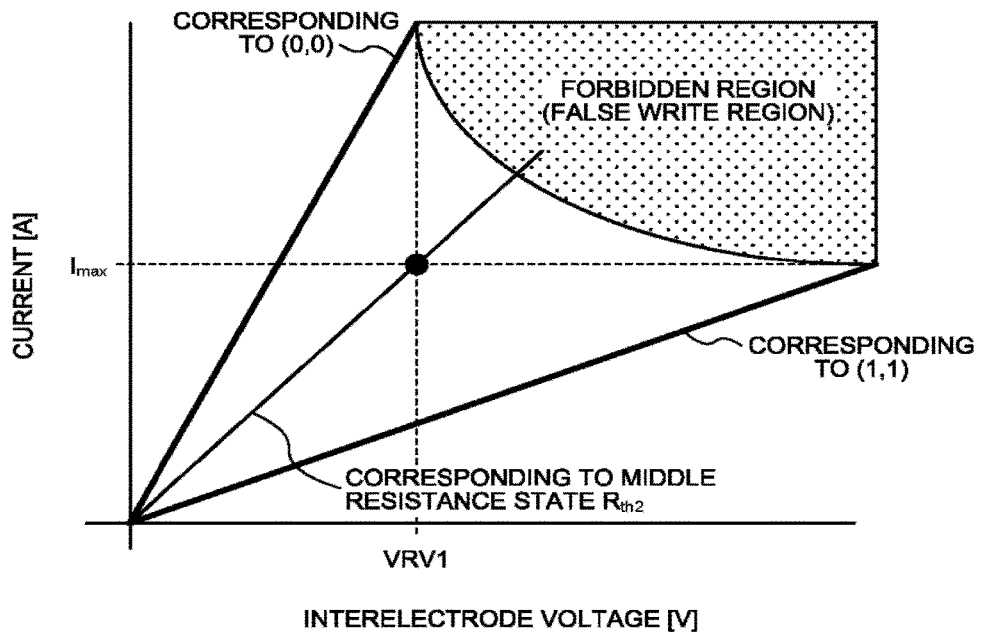
FIG. 4 is a graph illustrating the operation points of the storage element corresponding to a threshold resistance of the first embodiment.

The specific contents a first embodiment will be described with reference to FIGS. 4 to 10. First, with the word line WL connected to a storage element 101 to be read from being non-selected (WL being low) floating state), the first constant voltage VRV1 is applied to the bit line connected to that storage element 101. As shown in FIG. 4, this first constant voltage VRV1 is a maximum voltage among the voltages outside the forbidden region (false write region).

Figure 5:
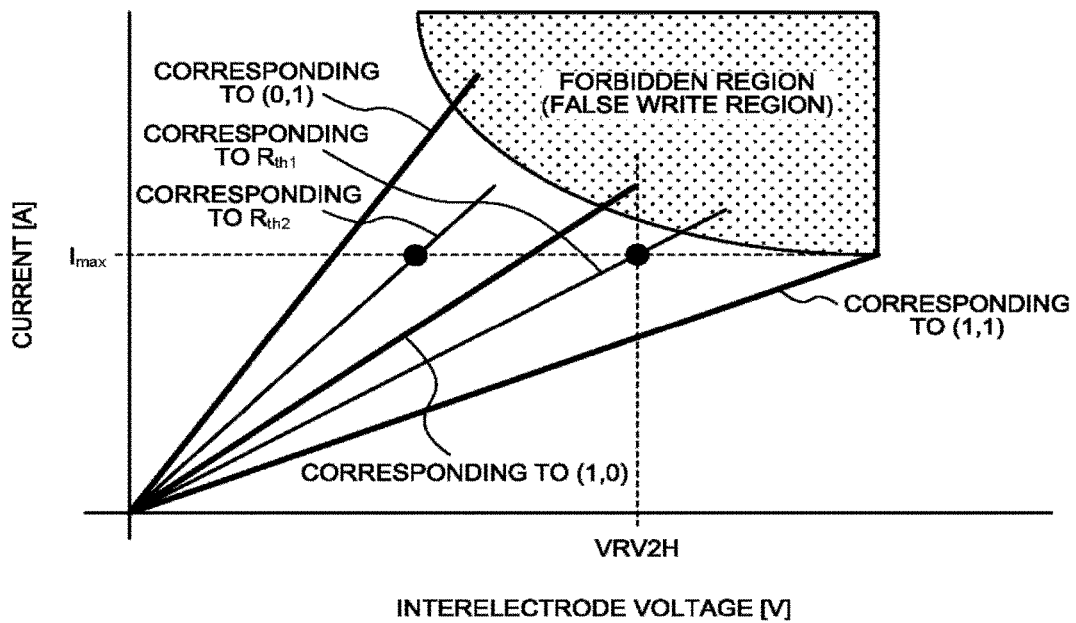
FIG. 5 is a graph illustrating the operation points of the storage element corresponding to threshold resistances of the first embodiment.
Figure 6:
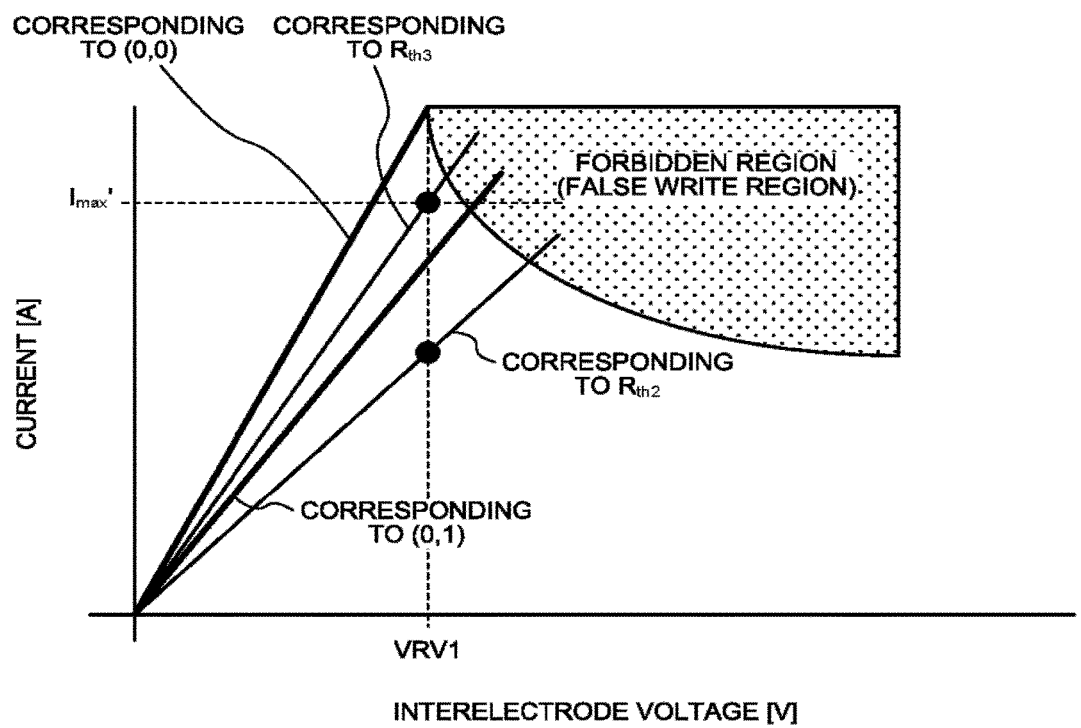
FIG. 6 is a graph illustrating the operation points of the storage element corresponding to threshold resistances of the first embodiment.
Figure 10:
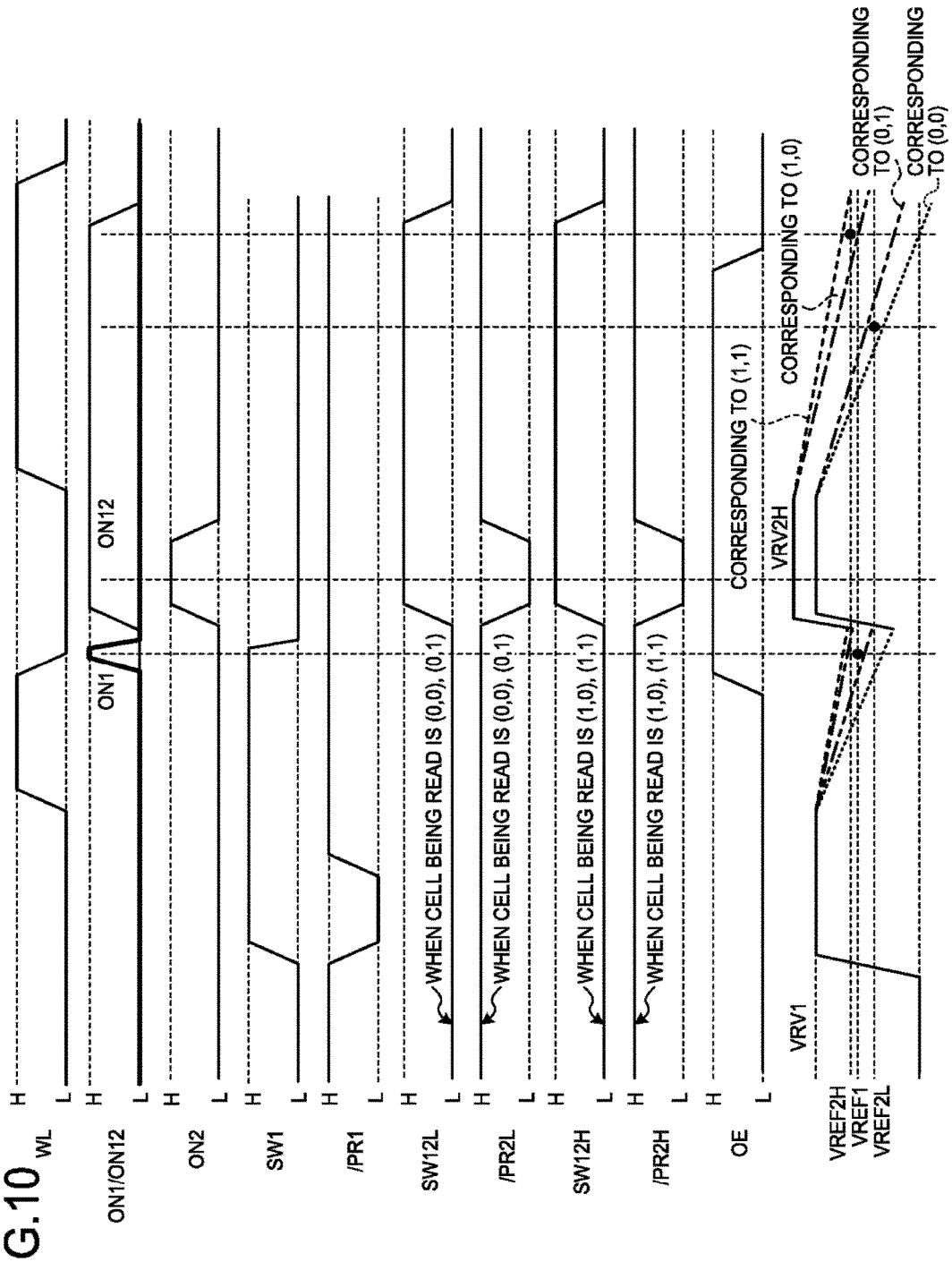
FIG. 10 is a timing chart for explaining the operation of the read unit of the first embodiment.

Further, herein a maximum current among the currents outside the forbidden region is called Imax. The straight line corresponding to the above threshold resistance $R_{th2}$ passes through the intersection of the straight line of Imax and the straight line of VRV1. That is, the first-selected constant voltage VRV1 is a maximum voltage at which to be able to avoid the forbidden region, and the intersection of this maximum voltage and the maximum current Imax at which to be able to avoid the forbidden region corresponds to the middle threshold resistance $R_{th2}$ from among the multiple threshold resistances. As shown in FIGS. 5 and 6, the straight line of this threshold resistance $R_{th2}$ (the straight line joining the above intersection and the origin) is located at the middle between (0, 1) and (1, 0). In the first read, it is determined whether the resistance state of the storage element 101 is among the two upper resistance states or the two lower resistance states out of the four resistance states. As shown in FIGS. 4 and 10, after the first constant voltage VRV1 is applied when in the floating state with the word line WL being non-selected, the word line WL is selected, so that the voltage on the bit line BL falls and is compared with the first reference voltage VREF1. Here, the setting is made such that, at the time of the first sensing (first read) (the time that the potential on the bit line BL falls to become lower than the reference potential of the operational amplifier), if the resistance value of the storage element 101 is at $R_{th2}$, the voltage on the bit line BL coincides with the first reference voltage VREF1.

The read unit 400, first, selects the first reference voltage VREF1 and the first constant voltage VRV1 as above and, if the voltage on the bit line BL when reading after applying the first constant voltage VRV1 exceeds the first reference voltage VREF1, supplies a second reference voltage VREF2H, higher than the first reference voltage VREF1, as the reference voltage corresponding to the threshold resistance $R_{th1}$ higher by one step than the middle threshold resistance $R_{th2}$ and supplies a second constant voltage VRV2H, higher than the first constant voltage VRV1, as the constant voltage so as to perform a second read. Here, the setting is made such that the operation points of the storage element 101 when reading after applying the first constant voltage VRV1 and the second constant voltage VRV2H to the bit line BL avoid the forbidden region. If the voltage on the bit line BL when reading after applying a kth constant voltage (k≥3) exceeds a kth reference voltage, the read unit 400 selects a k'th reference voltage, higher than the kth reference voltage, as the reference voltage corresponding to the threshold resistance higher by one step or more than the middle threshold resistance and selects a k'th constant voltage, higher than the kth constant voltage, as the constant voltage so as to read. Here, the setting is made such that the operation points of the storage element 101 when reading after applying the kth and k'th constant voltages to the bit line BL avoid the forbidden region. For example, if there are eight values, reference resistances may take values of 5/6 and 7/6 of the total resistance width. If there are 16 values, reference resistances may take values of 9/16, 11/16, 13/16, and 15/16 of the total resistance width.

The second read in the case where the resistance state of the storage element 101 read from in the first read is one of the two upper resistance states, i.e. (1, 1) or (1, 0), out of the four resistance states, will be described. After the first read, on the way to the second read, the read unit 400 temporarily renders the storage element 101 non-selected and then selects again (temporarily renders the word line WL non-selected and then selects again), and while the storage element 101 is non-selected, the bit line BL is precharged to the second constant voltage VRV2H. As shown in FIGS. 5 and 10, after the second constant voltage VRV2H is applied when in the floating state with the word line WL being non-selected, the word line WL is selected again, and the voltage on the bit line BL falls and is compared with the second reference voltage VREF2H. Here, the setting is made such that, at the time of the second sensing (second read) (the time that the potential on the bit line BL falls to become lower than the reference potential of the operational amplifier), if the resistance value of the storage element 101 is at $R_{th1}$, the voltage on the bit line BL coincides with the second reference voltage VREF2H. When the voltage on the bit line BL depending on the resistance state of the storage element 101 is smaller than the second reference voltage VREF2H, it is realized that the resistance state of the storage element 101 being read from is between the middle threshold resistance $R_{th2}$ and the one-step-higher threshold resistance $R_{th1}$ and thus the resistance state can be identified as (1, 0) (see FIG. 2). When the voltage on the bit line BL when reading after applying the second constant voltage VRV2H is greater than the second reference voltage VREF2H, it is realized that the resistance state of the storage element 101 being read from is greater in resistance than the one-step-higher threshold resistance $R_{th1}$, and thus the resistance state can be identified as (1, 1) (see FIG. 2).

The read unit 400, in the first read as above, first selects the first reference voltage VREF1 and the first constant voltage VRV1 and, if the voltage on the bit line BL when reading after applying the first constant voltage VRV1 is smaller than the first reference voltage VREF1, selects a third reference voltage VREF2L, smaller than the first reference voltage VREF1, as the reference voltage corresponding to the threshold resistance $R_{th3}$ lower by one step than the middle threshold resistance $R_{th2}$ and again selects the first constant voltage VRV1 as the constant voltage to perform the second read. Here, the setting is made such that the operation points of the storage element 101 when reading after applying the first constant voltage VRV1 to the bit line BL avoid the forbidden region. If the voltage on the bit line BL when reading after applying the first constant voltage VRV1 is smaller than the first reference voltage VREF1, the read unit 400 selects a k"th reference voltage, smaller than the kth reference voltage, as the reference voltage corresponding to the threshold resistance higher by one step or more than the kth threshold resistance (k≥3) and again selects the first constant voltage VRV1 as the constant voltage so as to read. Here, the setting is made such that the operation points of the storage element 101 when reading after applying the kth constant voltage to the bit line BL avoid the forbidden region. For example, if there are eight values, reference resistances may take values of 5/8 and 7/8 of the total resistance width. If there are 16 values, reference resistances may take values of 9/16, 11/16, 13/16, and 15/16 of the total resistance width.

FIG. 6 is a graph illustrating the second read in the case where the resistance state of the storage element 101 in the first read is one of the two lower resistance states, i.e., (0, 1) or (0, 0). After the first read, on the way to the second read, the read unit 400 temporarily renders the storage element 101 non-selected and then selects again, and while the storage element. 101 is non-selected, the bit line BL is precharged again to the first constant voltage VRV1. In this example, after the first reference voltage VREF1 is again applied when in the floating state with the word line WL being non-selected, the word line WL is selected again, and the voltage on the bit line BL falls and is compared with the third reference voltage VREF2L. Here, the setting is made such that, at the time of the second sensing (second read) (the time that the potential on the bit line BL falls to become lower than the reference potential of the operational amplifier), if the resistance value of the storage element 101 is at $R_{th3}$, the voltage on the bit line BL coincides with the third reference voltage VREF2L. When the voltage on the bit line BL depending on the resistance state of the storage element 101 is greater than the third reference voltage VREF2L, it is realized that the resistance state of the storage element 101 being read from is between the middle threshold resistance $R_{th2}$ and the one-step-lower threshold resistance $R_{th3}$, and thus the resistance state can be identified as (0, 1) (see FIG. 2). When the voltage on the bit line BL when reading after again applying the first constant voltage VRV1 is smaller than the third reference voltage VREF2L, it is realized that the resistance state of the storage element 101 being read from is smaller in resistance than the one-step-lower threshold resistance $R_{th3}$, and thus the resistance state can be identified as (0, 0) (see FIG. 2).

Figure 7:
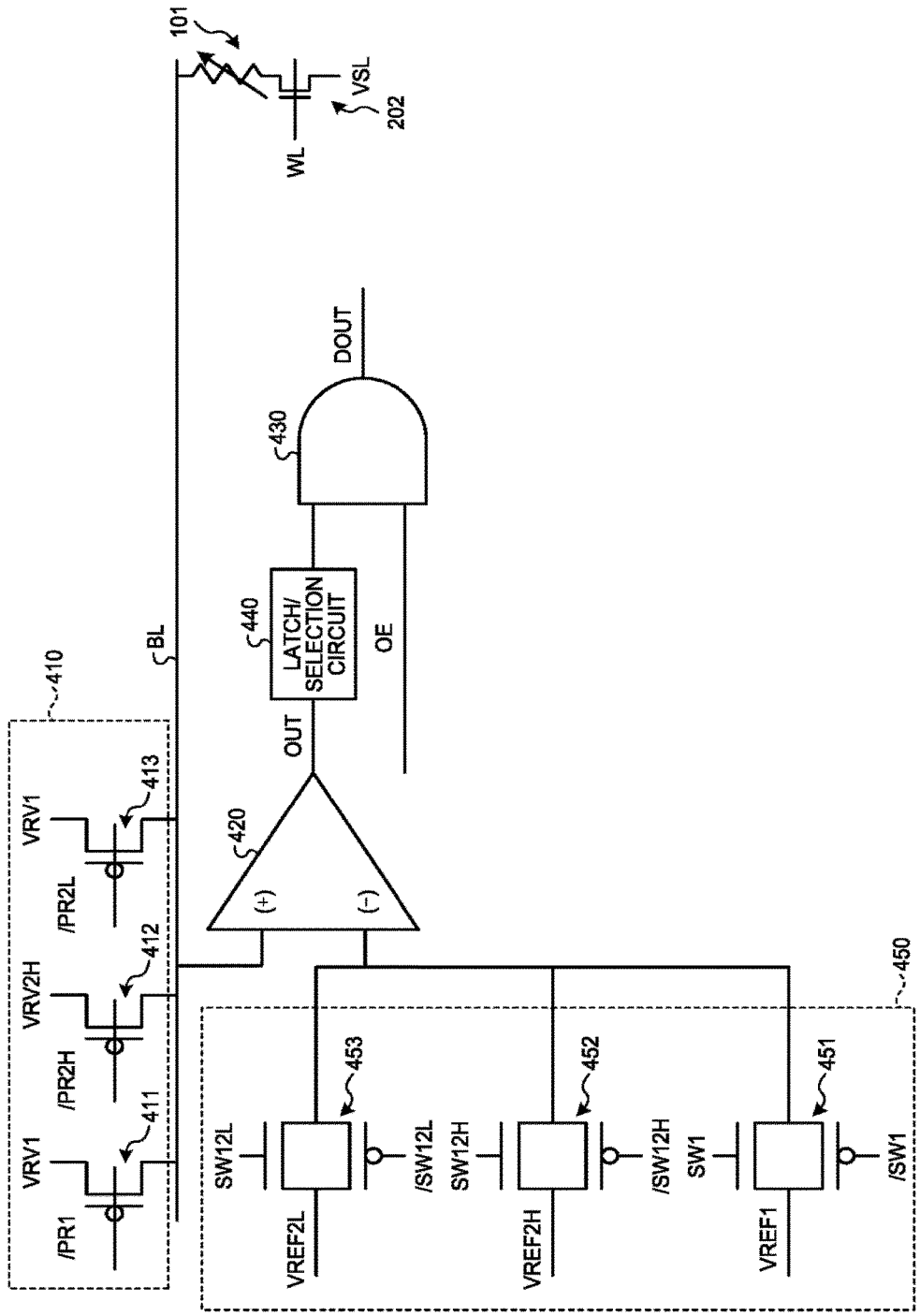
FIG. 7 is a diagram illustrating the circuit configuration of a read unit of the first embodiment.

FIG. 7 is a diagram illustrating an example configuration of a circuit for providing the function of selecting a reference voltage and a constant voltage from among the functions of the read unit 400. As shown in FIG. 7, the read unit 400 comprises at least a constant voltage supply unit 410, an operational amplifier 420, an AND circuit 430, a latch/selection circuit 440, and a reference voltage supply unit 450. A transistor 202 is provided for each storage element 101. The transistor 202 has a word line WL connected to its gate and is a cell transistor switch between conduction and non-conduction between the storage element 101 and a low potential power supply line VSL.

The constant voltage supply unit 410 is a circuit to supply a constant voltage to the bit line BL. In the example of FIG. 7, the supply unit 410 includes transistors 411, 412, 413. The transistor 411 switches between applying the first constant voltage VRV1 to the bit line BL and not applying and switches on/off according to the signal /PR1 inputted to its gate. In this example, the transistor 411 transitions to the ON state when the signal /PR1 goes low and transitions to the OFF state when the signal /PR1 goes high.

The transistor 412 switches between applying the second constant voltage VRV2H to the bit line BL and not applying and switches on/off according to the signal /PR2H inputted to its gate. In this example, the transistor 41 transitions to the ON state when the signal /PR2H goes low and transitions to the OFF state when the signal /PR2H goes high.

The transistor 413 switches between applying the first constant voltage VRV1 to the bit line BL and not applying and switches on/off according to the signal /PR2L inputted to its gate. In this example, the transistor 413 transitions to the ON state when the signal /PR2L goes low and transitions to the OFF state when the signal /PR2L goes high.

Note that the signal levels (H/L) of the signals /PR1, /PR2H, and /PR2L are controlled by the read unit 400.

The operational amplifier 420 outputs the result of comparing the voltage on the bit line BL and a reference voltage. In this example, the voltage on the bit line BL is inputted to the positive input side (non-inverting amplification terminal) of the operational amplifier 420, and the reference voltage is inputted to the negative input side (inverting amplification terminal). The output OUT of the operational amplifier 420 is inputted to the AND circuit 430 via the latch/selection circuit 440. An output enable signal (here called OE) is inputted to the AND circuit 430, and when the signal level of the OE goes high, the AND circuit 430 outputs an output DOUT.

The latch/selection circuit 440 latches the output OUT of the operational amplifier 420 and selects the next reference voltage and the next constant voltage according to the output OUT. The specific configuration will be described later.

The reference voltage supply unit 450 supplies a reference voltage to the negative input side (inverting amplification terminal) of the operational amplifier 420 and includes switching elements (complementary switches) 451, 452, 453. The switching element 451 switches between supplying the first reference voltage VREF1 to the negative input side (inverting amplification terminal) of the operational amplifier 420 and not supplying. The switching element 451 switches on/off according to a signal SW1. In this example, when the signal SW1 goes high, the switching element 451 transitions to the ON state and transitions to the OFF state when the signal SW1 goes low. Note that the signal level (H/L) of the signal SW1 is controlled by the read unit 400.

The switching element 452 switches between supplying the second reference voltage VREF2H to the negative input side (inverting amplification terminal) of the operational amplifier 420 and not supplying. The switching element 452 switches on/off according to a signal SW12H. In this example, when the signal SW12H goes high, the switching element 452 transitions to the ON state and transitions to the OFF state when the signal SW12H goes low. Note that the signal level (H/L) of the signal SW12H is controlled by the latch/selection circuit 440 as described later.

The switching element 453 switches between supplying the third reference voltage VREF2L to the negative input side (inverting amplification terminal) of the operational amplifier 420 and not supplying. The switching element 453 switches on/off according to a signal SW12L. In this example, when the signal SW12L goes high, the switching element 453 transitions to the ON state and transitions to the OFF state when the signal SW12L goes low. Note that the signal level of the signal SW12L is controlled by the latch/selection circuit 440 as described later.

Figure 8:
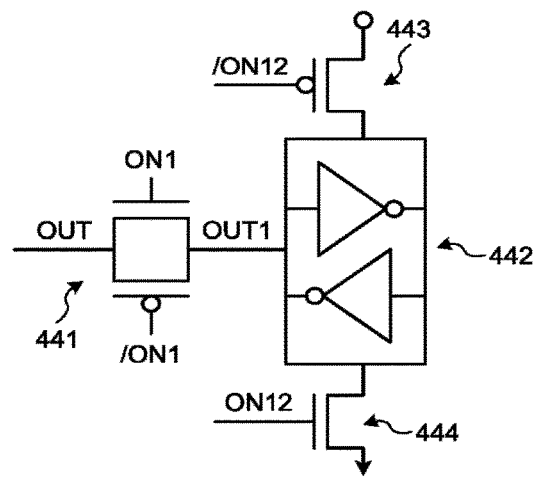
FIG. 8 is a diagram illustrating the configuration of a latch/selection circuit of the first embodiment.

Next, the configuration of the latch/selection circuit 440 will be described with reference to FIGS. 8 and 9. FIG. 8 is a diagram illustrating an example configuration of a circuit for providing the function of latching the above-mentioned output OUT from the operational amplifier 420 from among the functions of the latch/selection circuit 440. As shown in FIG. 8, the latch/selection circuit 440 comprises a switching element 441 and a latch circuit 442. The switching element 441 switches between supplying the output OUT from the operational amplifier 420 to the latch circuit 442 and not supplying. The switching element 441 switches on/off according to a signal ON1. In this example, when the signal ON1 goes high, the switching element 441 transitions to the ON state and transitions to the OFF state when the signal ON1 goes low. Note that the signal level (H/L) of the signal ON1 is controlled by the read unit 400.

The latch circuit 442 latches an output OUT1 (the output OUT from the operational amplifier 420) inputted via the switching element 441 turned on. The latch circuit 442 comprises transistors 443, 444 to switch between performing a latch operation and not performing. The signal levels of a signal /ON12 the inverse signal of a signal /ON12) inputted to the gate of the transistor 443 and of the signal ON12 inputted to the gate of the transistor 444 are controlled by the read unit 400.

Figure 9:
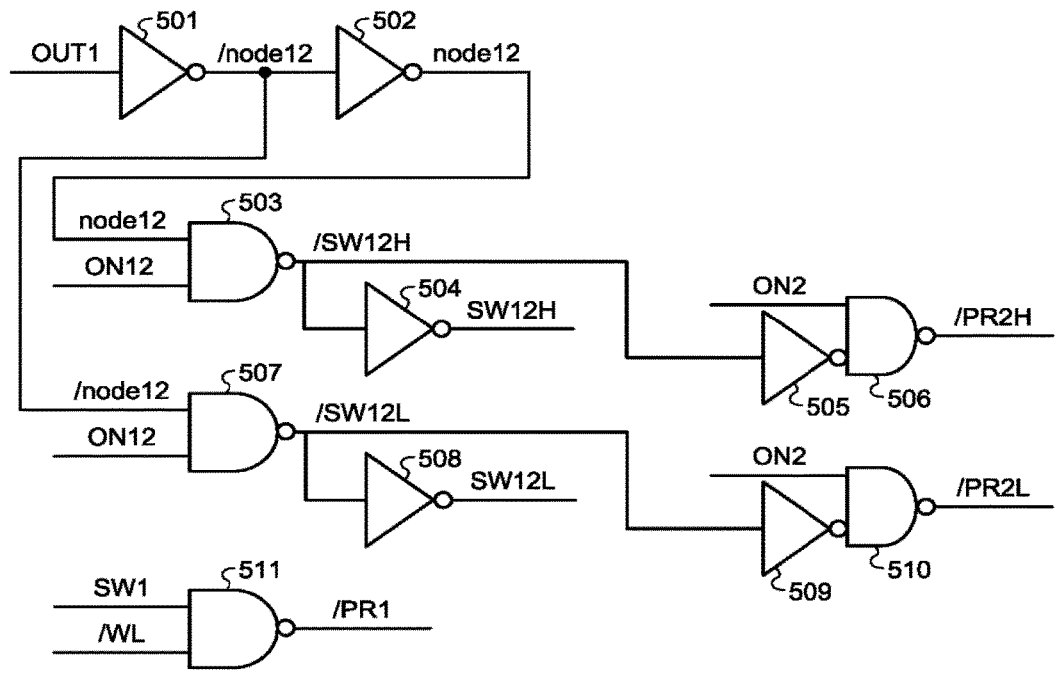
FIG. 9 is a diagram illustrating the configuration of the latch/selection circuit of the first embodiment.

FIG. 9 is a diagram illustrating an example configuration of a circuit (hereinafter may be called a selection circuit) for providing the function of selecting a constant voltage and a reference voltage from among the functions of the latch/selection circuit 440. As shown in FIG. 9, the latch/selection circuit 440 comprises an inverter 501, an inverter 502, a NAND circuit 503, an inverter 504, an inverter 505, a NAND circuit 506, a NAND circuit 507, an inverter 500, an inverter 509, a NAND circuit 510, and a NAND circuit 511. The signals SW1 and /WL (the signal denoting the inverse of the word line WL) are inputted to the NAND circuit 511, which takes a NAND logic of the signals SW1 and /WL to output a signal /PR1. That is, when SW1 becomes high, and while WL closed, the bit line BL is precharged.

The above-mentioned output OUT1 is inputted to the inverter 501. A signal /node12 generated by the inverter 501 inverting the output OUT1 is inputted to the inverter 502 and to the NAND circuit 507.

A signal node12 generated by the inverter 502 inverting the signal /node12 is inputted to the NAND circuit 503. The signal ON12 is also inputted to the NAND circuit 503, and when the signal ON12 is high and the signal node12 is high, a signal /SW12H outputted from the NAND circuit 503 is low, and otherwise the signal /SW12H outputted from the NAND circuit 503 is high. The signal /SW12H is inputted to the inverter 504. The signal /SW12H is inverted by the inverter 504 and outputted as a signal SW12H. The signal /SW12H is inputted also to the inverter 505. The signal /SW12H inverted by the inverter 505 is inputted to the NAND circuit 506. The signal /ON12 is also inputted to the NAND circuit 506, and when the signal ON12 is high and the signal /SW12H is low, a signal /PR2H outputted from the NAND circuit 506 is low, and otherwise the signal /PR2H outputted from the NAND circuit 506 is high.

Meanwhile, the signal ON12 is also inputted to the NAND circuit 507 having the above-mentioned signal /node12 inputted thereto, and when the signal ON12 is high, and the signal /node12 is high, a signal /SW12L outputted from the NAND circuit 507 is low, and otherwise the signal /SW12L is high. The signal /SW12L is inputted to the inverter 508. The signal /SW12L is inverted by the inverter 508 and outputted as a signal SW12L. Also the signal /SW12L is inputted to the inverter 509. The signal inverted by the inverter 509 is inputted to the NAND circuit 510, and the signal ON12 is also inputted to the NAND circuit 510, which takes a NAND logic thereof to output a signal /PR2L.

For example, suppose that in the first read, when the first constant voltage VRV1 is selected as the constant voltage, and the first reference voltage VREF1 is selected as the reference voltage, the output OUT of the operational amplifier 420 is low. That is, suppose that the first reference voltage VREF1 is higher than the voltage on the bit line BL when reading after applying the first constant voltage VRV1. In this case, with the circuits of FIGS. 8 and 9, the signal SW12L is high; the signal /PR2L is low; the signal SW12H is low; and the signal /PR2H is high, so that the third reference voltage VREF2L is selected as the reference voltage and that the first constant voltage VRV1 is again selected as the constant voltage.

In contrast, for example, suppose that the output OUT of the operational amplifier 420 is high, that is, the first reference voltage VREF1 is lower than the voltage on the bit line BL when reading after applying the first constant voltage VRV1. In this case, with the circuits of FIGS. 8 and 9, the signal SW12L is low; the signal /PR2L is high; the signal SW12H is high; and the signal /PR2H is low, so that the second reference voltage VREF2H is supplied as the reference voltage and that the second constant voltage VRV2H is supplied as the constant voltage.

FIG. 10 is a diagram illustrating an example timing chart when the read unit 400 controls various signals to select a reference voltage and a constant voltage in reading data from the selected storage element 101. In this example, the premise is that the bit line BL connected to the storage element 101 to be selected is already selected. That is, the premise is that the selection transistor 301 of the bit line BL connected to the storage element 101 to be selected is in the ON state.

As shown in FIG. 10, first, the read unit 400 controls the signal SW1 to be high and the signal /PR1 to be low. Thus, the transistor 411 and the switching element 451 transition to the ON state, so that the first constant voltage VRV1 is selected as the constant voltage to be applied to the bit line BL connected to the storage element 101 to be selected and that the first reference voltage VREF1 is selected as the reference voltage to be inputted to the negative input side (inverting amplification terminal) of the operational amplifier 420. The signal SW1 stays high until the signal ON1 described later goes low, so that the first reference voltage VREF1 is supplied to the inverting amplification terminal of the operational amplifier 420.

Then the read unit 400 selects the word line WL connected to the storage element 101 to be selected (WL being high). Specifically, the signal supplied to the gate of the selection transistor 201 of the word line WL connected to the storage element 101 to be selected is caused to go low, so that the selection transistor 201 transitions to the ON state. Thus, the precharged bit line BL (the bit line BL connected to the selected storage element 101) switches from the floating state to being connected to the low potential power supply line VSL via the storage element 101 (a cell resistance), so that the voltage on the bit line BL falls from the first constant voltage VRV1 correspondingly to the resistance state of the selected storage element 101. FIG. 10 shows the way that the voltage on the bit line BL fails for each of the resistance states (1, 1), (1, 0), (0, 1), (0, 0) of the storage element 101.

After the time has elapsed from when in the floating state to when the voltage on the bit line BL connected to the low potential power supply line VSL via the storage element 101 is compared with the first reference voltage VREF1 (if the resistance state of the storage element 101 corresponds to the middle threshold resistance $R_{th2}$, the time from when in the floating state after the first constant voltage VRV1 is applied to when the voltage on the bit line BL connected to the low potential power supply line VSL via the storage element 101 falls to the first reference voltage VREF1), the read unit 400 controls the signal ON1 to become high at a timing when the potential on the bit line BL can be compared (corresponding to a data read timing). By this means, the switching element 441 transitions to the ON state, so that the output OUT of the operational amplifier 420 is latched and inputted to the above selection circuit. Further, the read unit 400 controls the WL to become low. Thus, the word line WL connected to the selected storage element 101 again becomes non-selected. The read unit 400, after keeping the signal ON1 high for a predetermined time, controls the signal ON1 to go low. Then the read unit 400 controls the /PR2H and /PR2L to become low by means of a logic (not shown) in order to precharge the bit line BL.

Then as above, if the output OUT of the operational amplifier 420 is low, the signal SW12L is high; the signal /PR2L is low; the signal SW12H is low; and the signal /PR2H is high, so that the third reference voltage VREF2L is selected as the reference voltage and that the first constant voltage VRV1 is again selected as the constant voltage. If the output OUT of the operational amplifier 420 is high, the signal SW12L is low; the signal /PR2L is high; the signal SW12H is high; and the signal /PR2H is low, so that the second reference voltage VREF2H is selected as the reference voltage and that the second constant voltage VRV2H is selected as the constant voltage.

Then the read unit 400, in order to select the word line WL connected to the storage element 101 to be selected, controls the WL to go high. Thus, the bit line BL precharged to the second constant voltage VRV2H or a third constant voltage VRV2L switches from the floating state to being connected to the low potential power supply line VSL via the storage element 101, so that the voltage or the bit line BL falls correspondingly to the resistance state of the selected storage element 101. FIG. 10 shows the way that the voltage on the bit line BL falls for each of the resistance states (1, 1), (1, 0), (0, 1), (0, 0) of the storage element 101.

After the time has elapsed from when in the floating state to when the voltage on the bit line BL connected to the low potential power supply line VSL via the storage element 101 is compared with a reference voltage, the read unit 400 determines whether the bit line BL is high or low, that is, the resistance value of the storage element 101 (a cell) according to the comparing result of the operational amplifier 420. The time from when in the floating state after the second constant voltage VRV2H is applied, if the resistance state of the storage element 101 is greater than the threshold resistance $R_{th1}$, to when the voltage on the bit line BL connected to the low potential power supply line VSL via the storage element 101 falls to the second reference voltage VREF2H is longer than the time from when in the floating state after the first constant voltage VRV1 is again applied, if the resistance state of the storage element 101 is smaller than the threshold resistance $R_{th1}$, to when the voltage on the bit line BL connected to the low potential power supply line VSL via the storage element 101 falls to the third reference voltage VREF2L.

As such, in reading the data (multi-valued data) of the storage element 101, the read unit 400 of the present embodiment, selecting one at a time, applies multiple types of constant voltages to the storage element 101. More specifically, in reading the multi-valued data of the storage element 101, the read unit 400 selects a constant voltage so as to read avoiding the forbidden region that is a set of phase transition points indicating operation points at which a phase transition, occurs in the storage element 101. Thus, the multi-valued data read can be made faster suppressing data destruction.

Second Embodiment

Next, a second embodiment will be described. Description of the same parts as in the above first embodiment is omitted as needed. In the present embodiment, as described previously, if in the first read it is determined that the resistance state of the storage element 101 is among the two lower resistance states, (0, 1) or (0, 0), it is not performed applying the first constant voltage VRV1 again after temporarily rendering the storage element 101 non-selected and then selecting (temporarily rendering the word line WL non-selected and then selecting). Only if it is to be determined which of the two upper states, (1, 1) or (1, 0), the resistance state of the storage element 101 is, the storage element 101 is temporarily rendered non-selected and then selected. The second embodiment differs from the first embodiment in that during the time that the storage element 101 is non-selected, after the second constant voltage VRV2H is applied, the read is again performed. The specific contents thereof will be described below.

Also in the present embodiment, in reading the data of the storage element 101, the read unit 400 selects a constant voltage and a reference voltage so as to read at an operation point of as high a voltage and as high current as possible, avoiding the forbidden region that is a set of phase transition points. As in the above first embodiment, the read unit 400 sequentially selects one of multiple reference voltages corresponding to multiple (here three) threshold resistances ($R_{th1}$, $R_{th2}$, $R_{th3}$) to determine which of multiple resistance states the data of a storage element 101 selected to be read from is.

Figure 11:
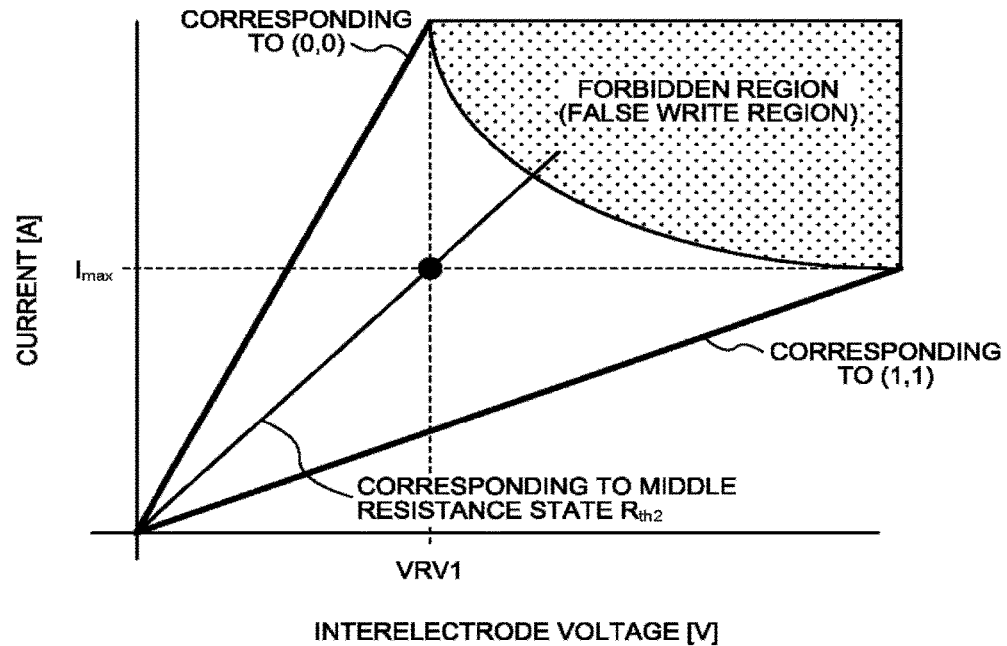
FIG. 11 is a graph illustrating the operation points of the storage element corresponding to a threshold resistance of a second embodiment.
Figure 12:
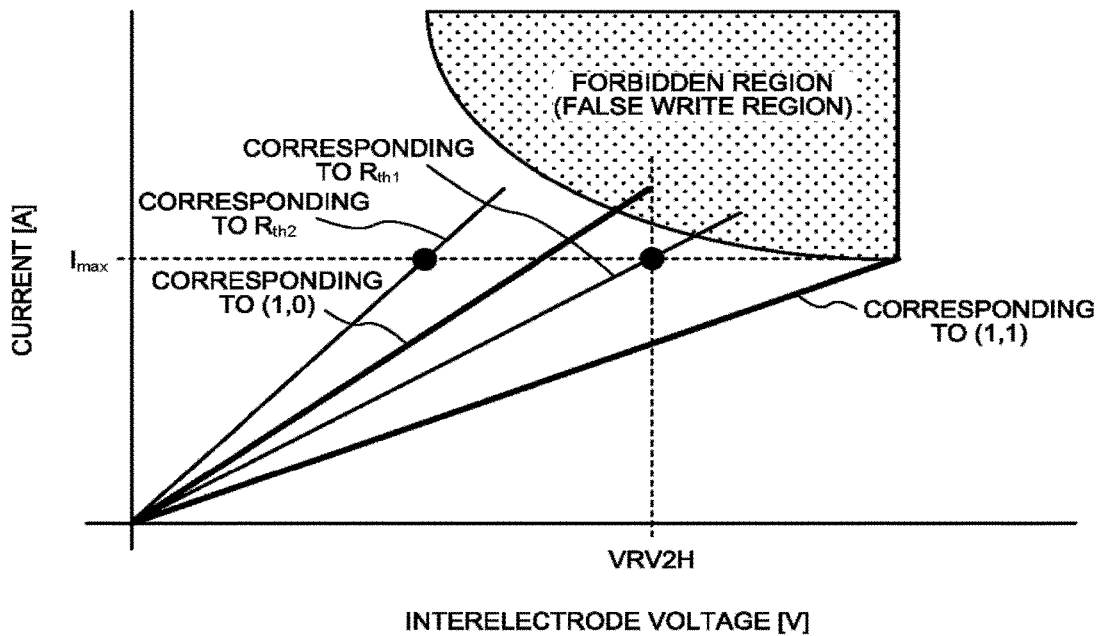
FIG. 12 is a graph illustrating the operation points of the storage element corresponding to threshold resistances of the second embodiment.
Figure 13:
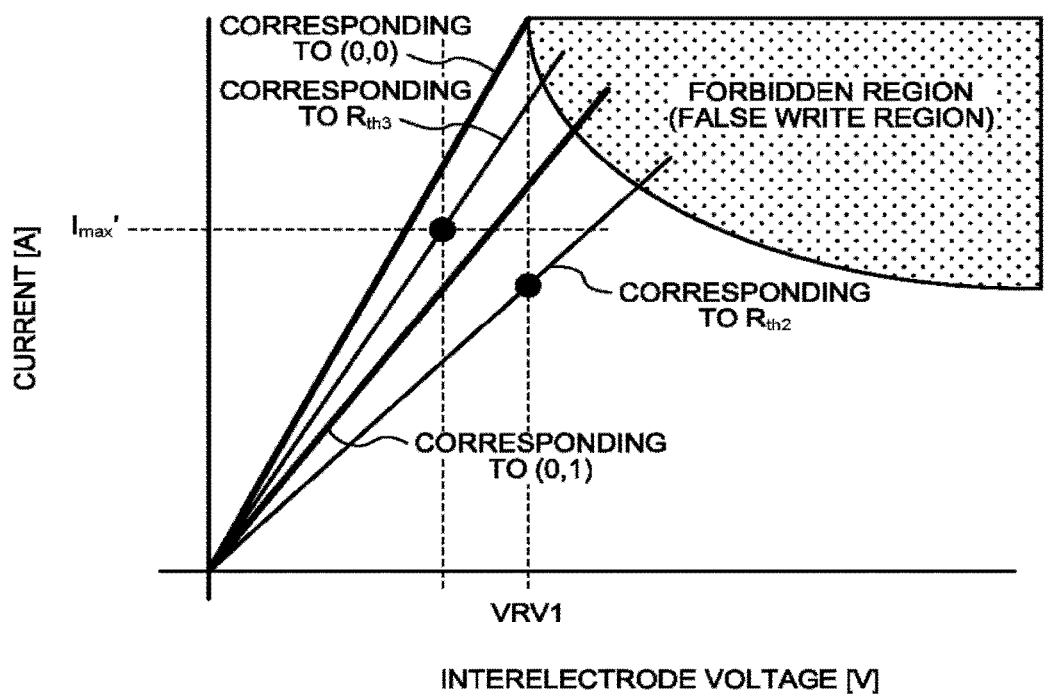
FIG. 13 is a graph illustrating the operation points of the storage element corresponding to threshold resistances of the second embodiment.

The specific contents of the second embodiment will be described with reference to FIGS. 11 to 16. First, with the word line WL connected to a storage element 101 to be read from being non-selected (a floating state), the first constant voltage VRV1 is applied to the bit line connected to that storage element 101. As shown in FIG. 11, this first constant voltage VRV1 is a maximum voltage among the voltages outside the forbidden region (false write region). Further, herein a maximum current among the currents outside the forbidden region is called Imax. The straight line corresponding to the above threshold resistance $R_{th2}$ passes through the intersection of the straight line of Imax and the straight line of VRV1. The intersection of this maximum voltage and the maximum current Imax at which to be able to avoid the forbidden region corresponds to the middle threshold resistance $R_{th2}$ from among the multiple threshold resistances. As shown in FIGS. 12 and 13, the straight line of this threshold resistance $R_{th2}$ (the straight line joining the above intersection and the origin) is located at the middle between (0, 1) and (1, 0). In the first read, it is determined whether the resistance state of the storage element 101 is among the two upper resistance states or the two lower resistance states out of the four resistance states. As shown in FIGS. 11 and 16, after the first constant voltage VRV1 is applied when in the floating state with the word line WL being non-selected, the word line WL is selected, so that the voltage on the bit line BL falls and is compared with the first reference voltage VREF1. Here, the setting is made such that, at the time of the first sensing (first read) (the time that the potential on the bit line BL falls to become lower than the reference potential of the operational amplifier), if the resistance value of the storage element 101 is at $R_{th2}$, the voltage on the bit line BL coincides with the first reference voltage VREF1.

The read unit 400, first, selects the first reference voltage VREF1 and the first constant voltage VRV1 as above and, if the voltage on the bit line BL when reading after applying the first constant voltage VRV1 exceeds the first reference voltage VREF1, selects the second reference voltage VREF2H, higher than the first reference voltage VREF1, as the reference voltage corresponding to the threshold resistance $R_{th1}$ higher by one step than the middle threshold resistance $R_{th2}$ and selects the second constant voltage VRV2H, higher than the first constant voltage VRV1, as the constant voltage so as to perform the second read. Here, the setting is made such that the operation points of the storage element 101 when reading after applying the first constant voltage VRV1 and the second constant voltage VRV2H to the bit line BL avoid the forbidden region. After the first read, on the way to the second read, the read unit 400 temporarily renders the storage element 101 non-selected and then selects (temporarily renders the word line WL non-selected and then selects), and while the storage element 101 is non-selected, the bit line BL is precharged to the second constant voltage VRV2H. As shown in FIGS. 12 and 16, after the second constant voltage VRV2H is applied when in the floating state with the word line WL being non-selected, the word line WL is selected, and the voltage on the bit line BL falls and is compared with the second reference voltage VREF2H. Here, the setting is made such that, at the time of the second sensing (second read) (the time that the potential on the bit line BL falls to become lower than the reference potential of the operational amplifier), if the resistance value of the storage element 101 is at $R_{th1}$, the voltage on the bit line BL coincides with the second reference voltage VREF2H.

In contrast, as above, the read unit 400 first selects the first reference voltage VREF1 and the first constant voltage VRV1 and, if the voltage on the bit line BL when reading after applying the first constant voltage VRV1 is smaller than the first reference voltage VREF1, selects the third reference voltage VREF2L, lower than the first reference voltage VREF1, as the reference voltage corresponding to the threshold resistance $R_{th3}$ lower by one step than the middle threshold resistance $R_{th2}$ and does not again apply a constant voltage (does not again select the first constant voltage VRV1 nor another constant voltage), so as to perform the second read. Here, the setting is made such that the operation points of the storage element 101 when reading after applying the first constant voltage VRV1 to the bit line BL avoid the forbidden region.

When the voltage on the bit line BL (depending on the resistance state of the storage element 101) at the read point is greater than the third reference voltage VREF2L, it is realized that the resistance state of the storage element 101 being read from is between the middle threshold resistance $R_{th2}$ and the one-step-lower threshold resistance $R_{th3}$, and thus the resistance state can be identified as (0, 1) (see FIG. 2). When the voltage on the bit line BL at the read point is smaller than the third reference voltage VREF2L, it is realized that the resistance state of the storage element 101 being read from is smaller in resistance than the Threshold resistance $R_{th3}$, and thus the resistance state can be identified as (0, 0) (see FIG. 2).

Figure 14:
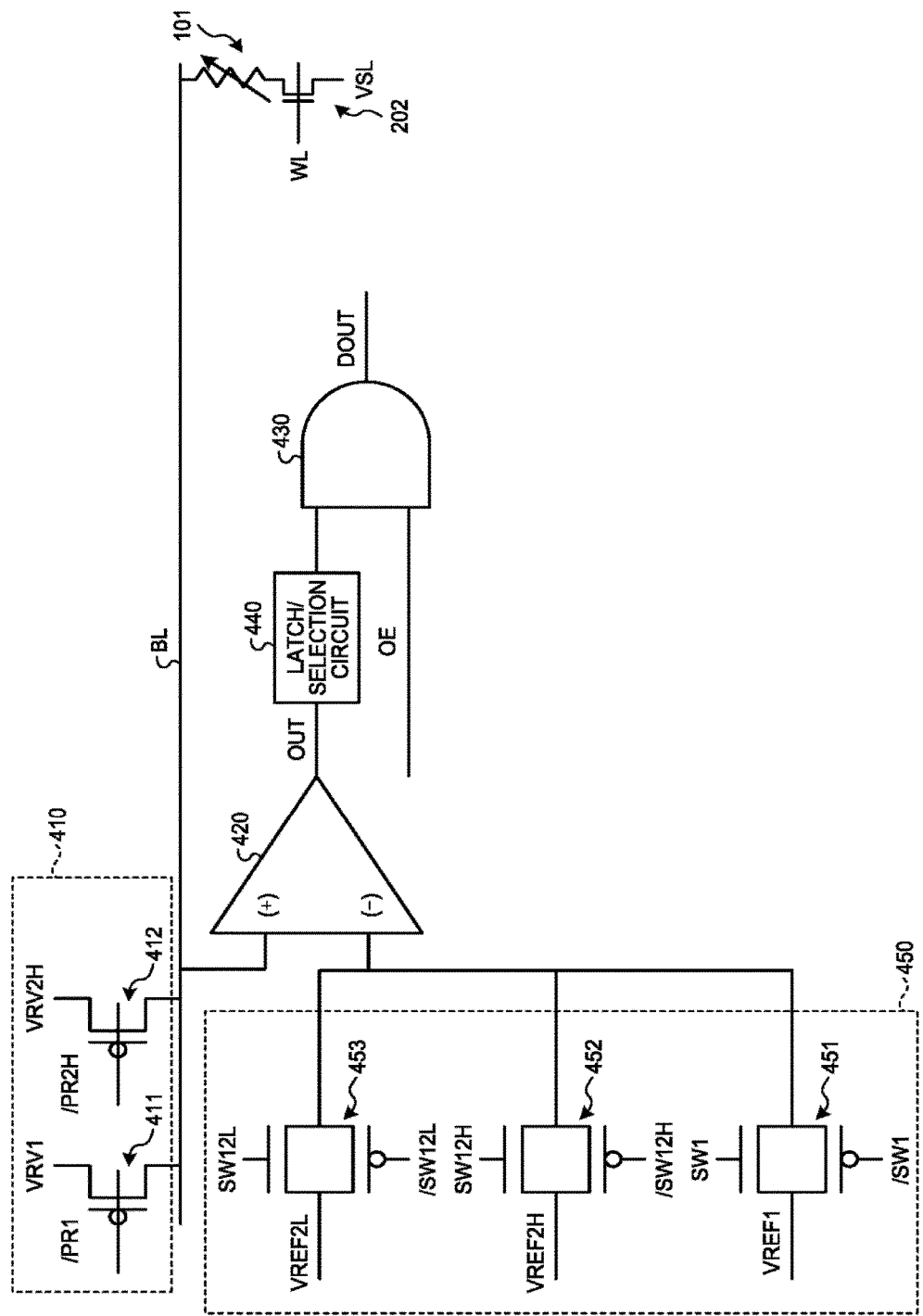
FIG. 14 is a diagram illustrating the circuit configuration of a read unit of the second embodiment.

FIG. 14 is a diagram illustrating an example configuration of a circuit for providing the function of selecting a reference voltage and a constant voltage from among the functions of the read unit 400. As shown in FIG. 14, the constant voltage supply unit 410 is different than in the first embodiment in that it includes the transistors 411, 112 but not the transistor 413.

Although the configuration of the selection circuit of the latch/selection circuit 440 is partially different than in the first embodiment as described later, the other configuration is the same as in the first embodiment.

Figure 15:
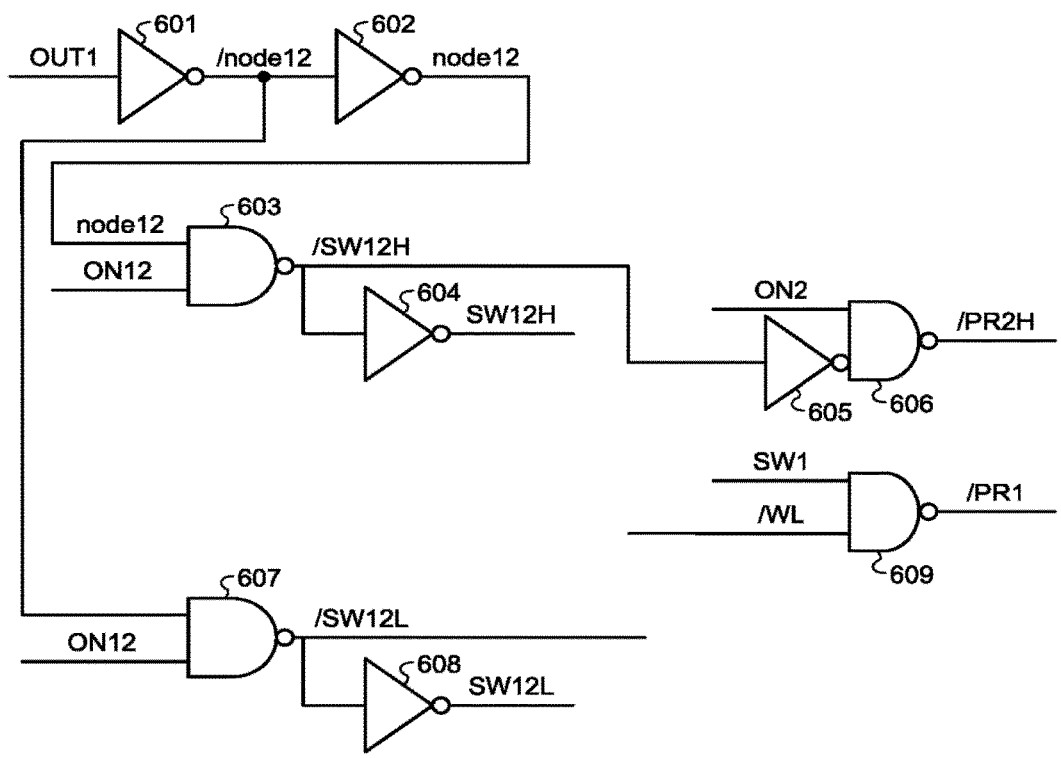
FIG. 15 is a diagram illustrating the configuration of a latch/selection circuit of the second embodiment.
Figure 16:
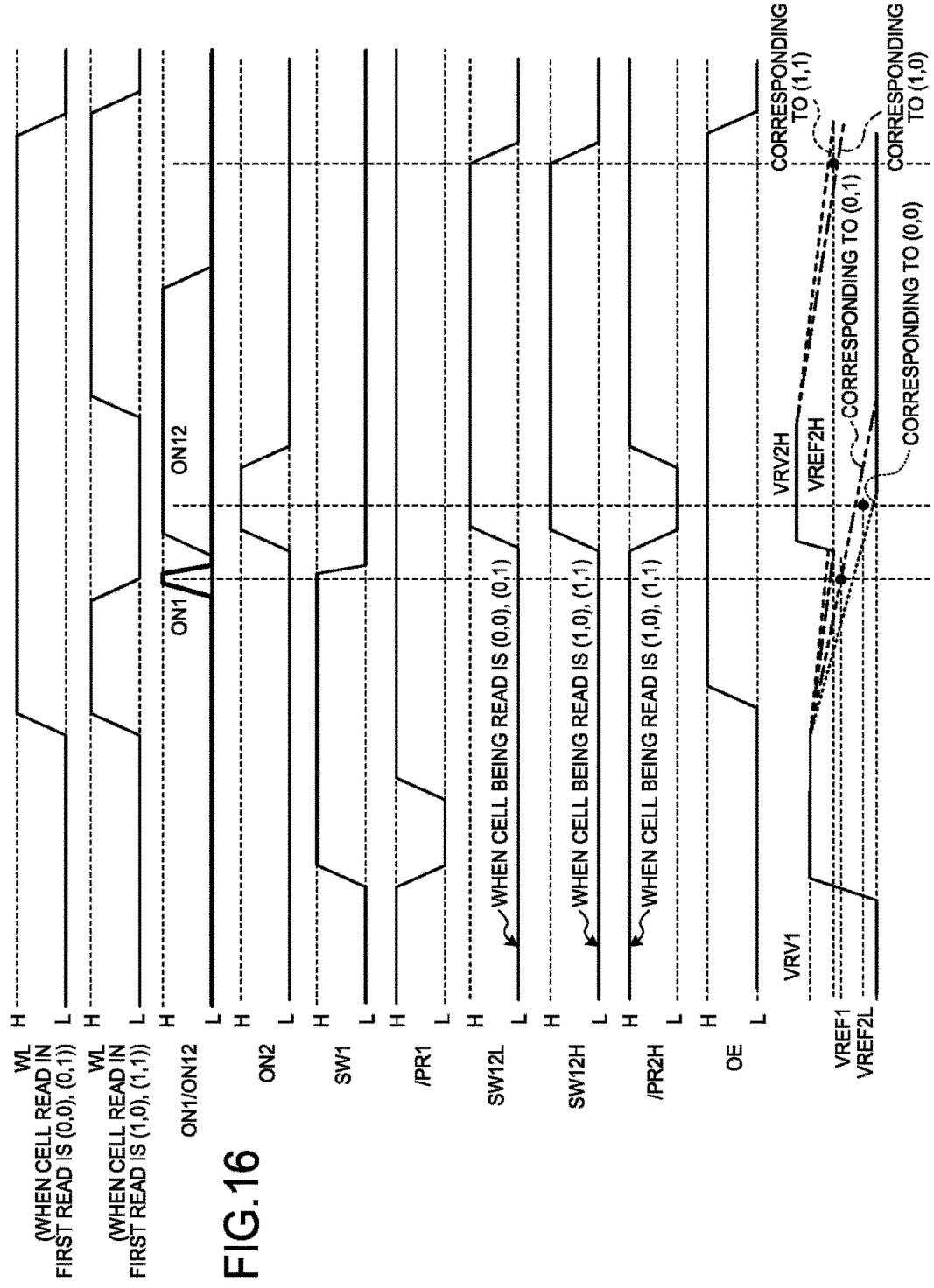
FIG. 16 is a timing chart for explaining the operation of the read unit of the second embodiment.

FIG. 15 is a diagram illustrating an example configuration of the selection circuit of the latch/selection circuit 440 of the present embodiment. As shown in FIG. 15, the latch/selection circuit 440 comprises an inverter 601, an inverter 602, a NAND circuit 603, an inverter 604, an inverter 605, a NAND circuit 606, a NAND circuit 607, and an inverter 600. The latch/selection circuit 440 further comprises a NAND circuit 609.

The above-mentioned output OUT1 from the operational amplifier 420 through the switching element 441 is inputted to the inverter 601. A signal /node12 generated by the inverter 601 inverting the OUT1 is inputted to the inverter 602. A signal node12 generated by the inverter 602 inverting the signal /node12 is inputted to the NAND circuit 603. The signal ON12 is also inputted to the NAND circuit 603, and when the signal ON12 is high and the signal node12 is high, a signal /SW12H outputted from the NAND circuit 603 is low, and otherwise the signal /SW12H is high. The signal /SW12H is inputted to the inverter 604. The signal /SW12H is inverted by the inverter 604 and outputted as a signal SW12H. Also the signal /SW12H is inputted to the inverter 605. The signal /SW12H inverted by the inverter 605 is inputted to the NAND circuit 606. The signal ON12 is also inputted to the NAND circuit 606, which takes a NAND logic thereof to output a signal /PR2H. The signal /node12 and the signal ON12 are inputted to the NAND circuit 607, which takes a NAND logic thereof to output a signal /SW12L. The signal /SW12L is inverted by the inverter 608 and outputted as a signal SW12L.

As shown in FIG. 15, the signals SW1 and /WL are inputted to the NAND circuit 609, which takes a NAND logic thereof to output a signal /PR1.

For example, suppose that in the first read, when the first constant voltage VRV1 is selected as the constant voltage, and the first reference voltage VREF1 is selected as the reference voltage, the output OUT of the operational amplifier 420 is low. That is, suppose that the first reference voltage VREF1 is higher than the voltage on the bit line BL when reading after applying the first constant voltage VRV1. In this case, with the circuits of FIGS. 8 and 15, the signal SW12L is high and the signal SW12H is low, so that the third reference voltage VREF2L is selected as the reference voltage. At this time, the signal /PR2H and the signal /PR1 are high, so that no constant voltage is selected, which will be described in detail later.

In contrast, for example, suppose that the output OUT of the operational amplifier 420 is high, that is, the first reference voltage VREF1 is lower than the voltage on the bit line BL corresponding to the resistance state of the storage element 101. In this case, with the circuits of FIGS. 8 and 15, the signal SW2L is low, and the signal SW12H is high, so that the second reference voltage VREF2H is selected as the reference voltage. At this time, the signal /PR2H is low, and the signal /PR1 is high, so that the second constant voltage VRV2H is selected as the constant voltage, which will be described in detail later.

FIG. 16 is a diagram illustrating an example timing chart when the read unit 400 controls various signals to select a reference voltage and a constant voltage in reading data from the selected storage element 101. In this example, the premise is that the bit line BL connected to the storage element 101 to be selected is already selected.

As shown in FIG. 16, first, the read unit 400 controls the signal SW1 to be high and the signal /PR1 to be low for a predetermined period, which signal is generated by taking a NAND logic of the signals SW1 and /WL. Thus, the transistor 411 and the switching element 451 transition to the ON state, so that the first constant voltage VRV1 is selected as the constant voltage to be applied to the bit line BL connected to the storage element 101 to be selected and that the first reference voltage VREF1 is selected as the reference voltage to be inputted to the negative input side (inverting amplification terminal) of the operational amplifier 420.

Then the read unit 400 selects the word line WL connected to the storage element 101 to be selected. Specifically, the signal supplied to the gate of the selection transistor 201 of the word line WL connected to the storage element 101 to be selected is caused to go low, so that the selection transistor 201 transitions to the ON state. Thus, the precharged bit line BL switches from the floating state to being connected to the low potential power supply line VSL via the storage element 101, so that the voltage on the bit line BL falls from the first constant voltage VRV1 correspondingly to the resistance state of the selected storage element 101. FIG. 16 shows the way that the voltage on the bit line BL falls for each of the resistance states (1, 1), (1, 0), (0, 1), (0, 0) of the storage element 101.

After the time has elapsed from when in the floating state to when the voltage on the bit line BL connected to the low potential power supply line VSL via the storage element 101 is compared with the first reference voltage VREF1, the read unit 400 controls the signal ON1 to be high for a predetermined period while outputting the comparing result of the operational amplifier 420. By this means, the switching element 441 transitions to the ON state, so that the output OUT of the operational amplifier 420 is inputted to the latch circuit and to the above selection circuit.

As above, if the output OUT of the operational amplifier 420 is low, the signal SW12L is high, and the signal SW12H is low, so that the third reference voltage VREF2L is selected as the reference voltage. At this time, the signal /PR2H is high. Further, at this time, the read unit 400 keeps the signal SW1 low, so that the signal /PR1 is high. Thus, no constant voltage is selected. In this case, the bit line BL is not again precharged, and a logic circuit (not shown) keeps the WL high. After the time has elapsed from when in the floating state to when the voltage on the bit line BL connected to the low potential power supply line VSL via the storage element 101 is compared with a reference voltage (the third reference voltage VREF2L), the read unit 400 determines the resistance value of the storage element 101 according to the comparing result of the operational amplifier 420.

In contrast, if the output OUT of the operational amplifier 420 is high, the signal SW12L is low, and the signal SW12H is high, so that the second reference voltage VREF2H is selected as the reference voltage. At this time, the signal /PR2H is low, and the signal /PR1 is high (because the signal SW1 is kept low as above), so that the second constant voltage VRV2H is selected as the constant voltage. In response to the output OUT of the operational amplifier 420 being high, the read unit 400 controls the WL to become low. Thus, the word line WL connected to the selected storage element 101 is again rendered non-selected. The read unit 400 controls the signal ON12 to go high in order to precharge the bit line BL. Then the read unit 400 controls the WL to go high, so that the bit line BL precharged to the second constant voltage VRV2H is switched from the floating state to being connected to the low potential power supply line VSL via the storage element 101. The voltage on the bit line BL precharged to the second constant voltage VRV2H falls correspondingly to the resistance state (1, 1) or (1, 0) of the selected storage element 101. The example of FIG. 16 shows the way that the voltage on the bit line BL falls for each of the resistance states (1, 1), (1, 0) of the storage element 101. After the time has elapsed from when in the floating state to when the voltage on the bit line BL connected to the low potential power supply line VSL via the storage element 101 is compared with the second reference voltage VREF2H, the read unit 400 determines the resistance value of the storage element 101 according to the comparing result of the operational amplifier 420.

Third Embodiment

Next, a third embodiment will be described. Description of the same parts as in the above embodiments is omitted as needed. The present embodiment differs from the above embodiments in that the read unit 400 reads the data of the storage element 101 while switching between the constant voltage read method which applies a constant voltage to read tree data of the storage element 101 and a constant current read method which applies a constant current to read the data of the storage element 101. In the present embodiment, the read unit 400 switches from the constant voltage read method to the constant current read method so as to read the data of the storage element 101. A specific description will be made below.

Figure 17:
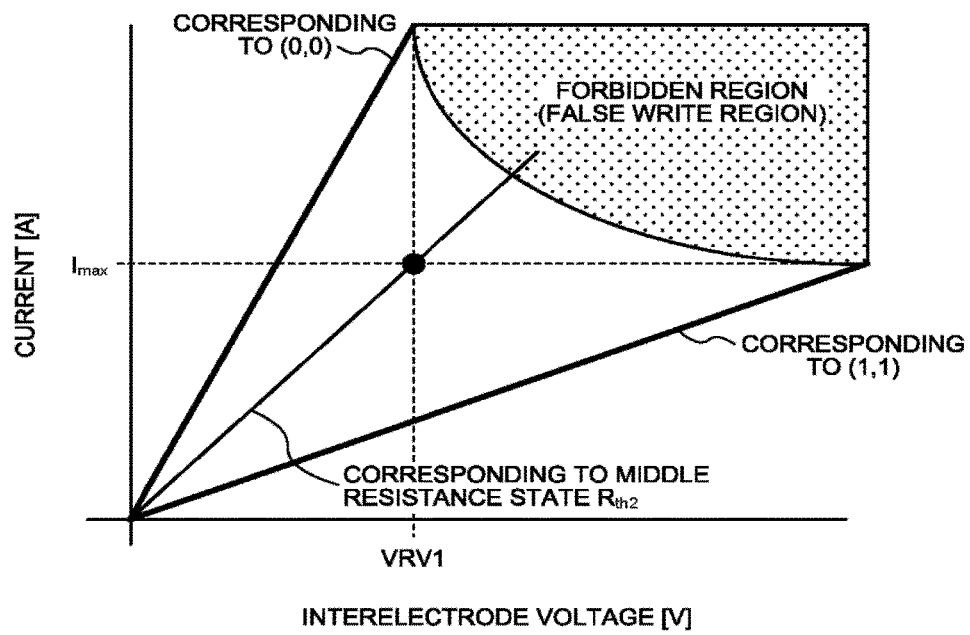
FIG. 17 is a graph illustrating the operation points of the storage element corresponding to a threshold resistance of a third embodiment.
Figure 18:
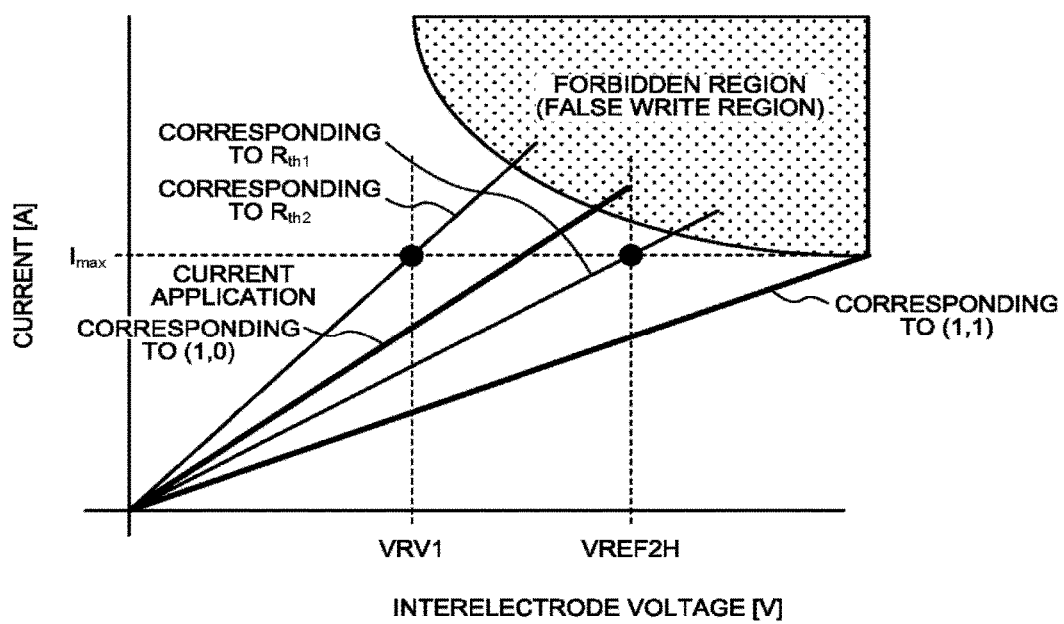
FIG. 18 is a graph illustrating the operation points of the storage element corresponding to threshold resistances of the third embodiment.
Figure 19:
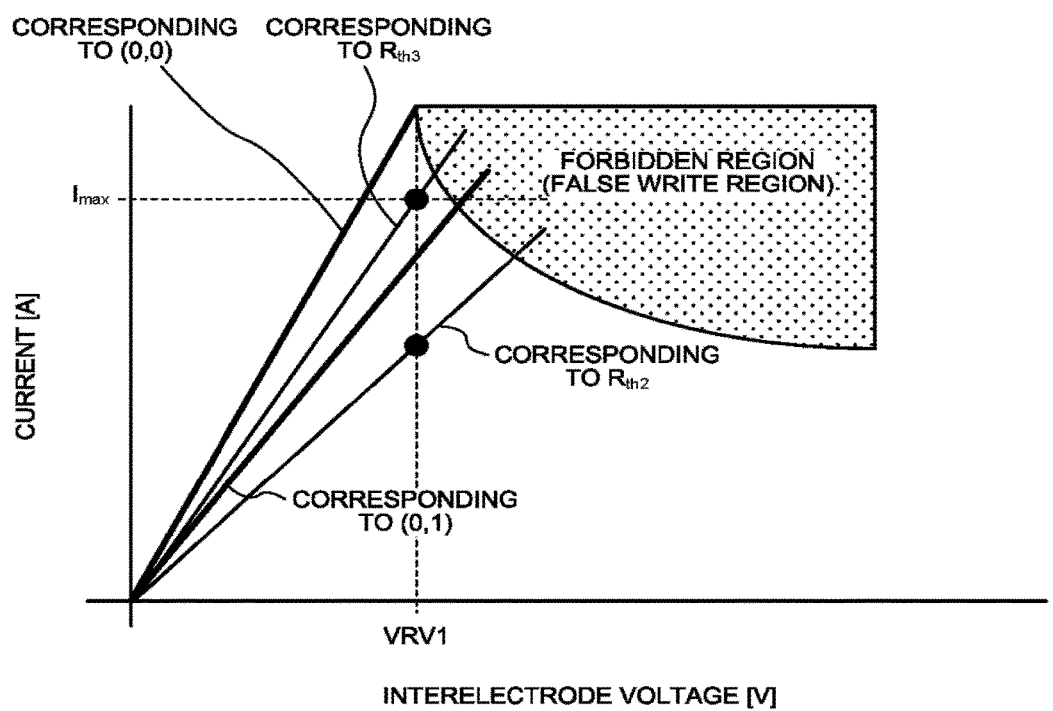
FIG. 19 is a graph illustrating the operation points of the storage element corresponding to threshold resistances of the third embodiment.

The specific contents of the third embodiment will be described with reference to FIGS. 17 to 23. First, with the word line WL connected to a storage element 101 to be read from being non-selected (the floating state), the first constant voltage VRV1 is applied to the bit line connected to that storage element 101. As shown in FIG. 17, this first constant voltage VRV1 is a maximum voltage among the voltages outside the forbidden region (false write region). Further, herein a maximum current among the currents outside the forbidden region is called Imax. The straight line corresponding to the above threshold resistance $R_{th2}$ passes through the intersection of the straight line of Imax and the straight line of VRV1. That is, the first-selected constant voltage VRV1 is a maximum voltage at which to be able to avoid the forbidden region, and the intersection of this maximum voltage and the maximum current Imax at which to be able to avoid the forbidden region corresponds to the middle threshold resistance $R_{th2}$ from among the multiple threshold resistances. As shown in FIGS. 18 and 19, this straight line of the threshold resistance $R_{th2}$ (the straight line joining the above intersection and the origin) is located at the middle between (0, 1) and (1, 0). In the first read, it is determined whether the resistance state of the storage element 101 is among the two upper resistance states or the two lower resistance states out of the four resistance states. As shown in FIGS. 17 and 23, after the first constant voltage VRV1 is applied when in the floating state with the word line WL being non-selected (WL being low), the word line WL is selected (WL being high), so that the voltage on the bit line BL falls and is compared with the first reference voltage VREF1. Here, the setting is made such that, at the time of the first sensing (first read) (the time that the potential on the bit line BL falls to become lower than the reference potential of the operational amplifier), if the resistance value of the storage element 101 is at $R_{th2}$, the voltage on the bit line BL coincides with the first reference voltage VREF1.

The read unit 400, first, selects the first reference voltage VREF1 and the first constant voltage VRV1 as above and, if the voltage on the bit line BL when reading after applying the first constant voltage VRV1 exceeds the first reference voltage VREF1, selects the second reference voltage VREF2H, higher than the first reference voltage VREF1, as the reference voltage corresponding to the threshold resistance $R_{th1}$ higher by one step than the middle threshold resistance $R_{th2}$ and applies the above maximum current Imax as the constant current to perform the read. Here, the setting is made such that the operation point of the storage element 101 when reading while applying the maximum current Imax avoids the forbidden region.

As shown in FIG. 18, the second reference voltage VREF2H and the maximum current Imax are set such that the operation point of the storage element 101 defined by the second reference voltage VREF2H and the maximum current Imax avoids the forbidden region and corresponds to the threshold resistance $R_{th1}$ higher by one step than the middle threshold resistance $R_{th2}$. The voltage on the bit line BL when reading while applying the maximum current Imax is determined as the voltage at which the discharge amount depending on the resistance state of the storage element 101 and the supplied maximum current Imax are in balance, and if the voltage on the bit line BL is smaller than the second reference voltage VREF2H, it is realized that the resistance state of the storage element 101 being read from is between the middle threshold resistance $R_{th2}$ and the one-step-higher threshold resistance $R_{th1}$, and thus the resistance state can be identified as (1, 0) (see FIG. 2). If the voltage on the bit line BL when reading while applying the maximum current Imax is greater than the second reference voltage VREF2H, it is realized that the resistance state of the storage element 101 being read from is greater in resistance than the threshold resistance $R_{th1}$, and thus the resistance state can be identified as (1, 1) (see FIG. 2).

The read unit 400, as above, first selects the first reference voltage VREF1 and the first constant voltage VRV1 and, if the voltage on the bit line BL when reading after applying the first constant voltage VRV1 (the voltage on the bit line BL depending on the resistance state of the storage element 101, which is connected to the low potential power supply line VSL via the storage element 101 subsequent to the floating state after precharged to the first constant voltage VRV1) is smaller than the first reference voltage VREF1, selects the third reference voltage VREF2L, smaller than the first reference voltage VREF1, as the reference voltage corresponding to the threshold resistance $R_{th3}$ lower by one step than the middle threshold resistance $R_{th2}$ and again selects the first constant voltage VRV1 as the constant voltage to perform the second read. Here, the setting is made such that the operation points of the storage element 101 when reading after applying the first constant voltage VRV1 avoid the forbidden region.

As shown in FIGS. 19 and 23, the setting is made such that the operation point of the storage element 101 at which the voltage on the bit line BL, which is connected to the low potential power supply line VSL via the storage element 101 subsequent to the floating state after the first constant voltage VRV1 is again applied, coincides with the third reference voltage VREF2L, avoids the forbidden region, the operation point being the read point. If the result of the second read is high (the voltage on the bit line BL connected to the low potential power supply line VSL via the storage element 101 subsequent to the floating state after the first constant voltage VRV1 is again applied, exceeds the third reference voltage VREF2L), it is realised that the resistance state of the storage element 101 being read from is between the middle threshold resistance $R_{th2}$ and the one-step-lower threshold resistance $R_{th3}$, and thus the resistance state can be identified as (0, 1) (see FIG. 2). If the result of the second read is low, it is realized that the resistance state of the storage element 101 being read from is smaller in resistance than the threshold resistance $R_{th3}$, and thus the resistance state can be identified as (0, 0) (see FIG. 2).

Figure 20:
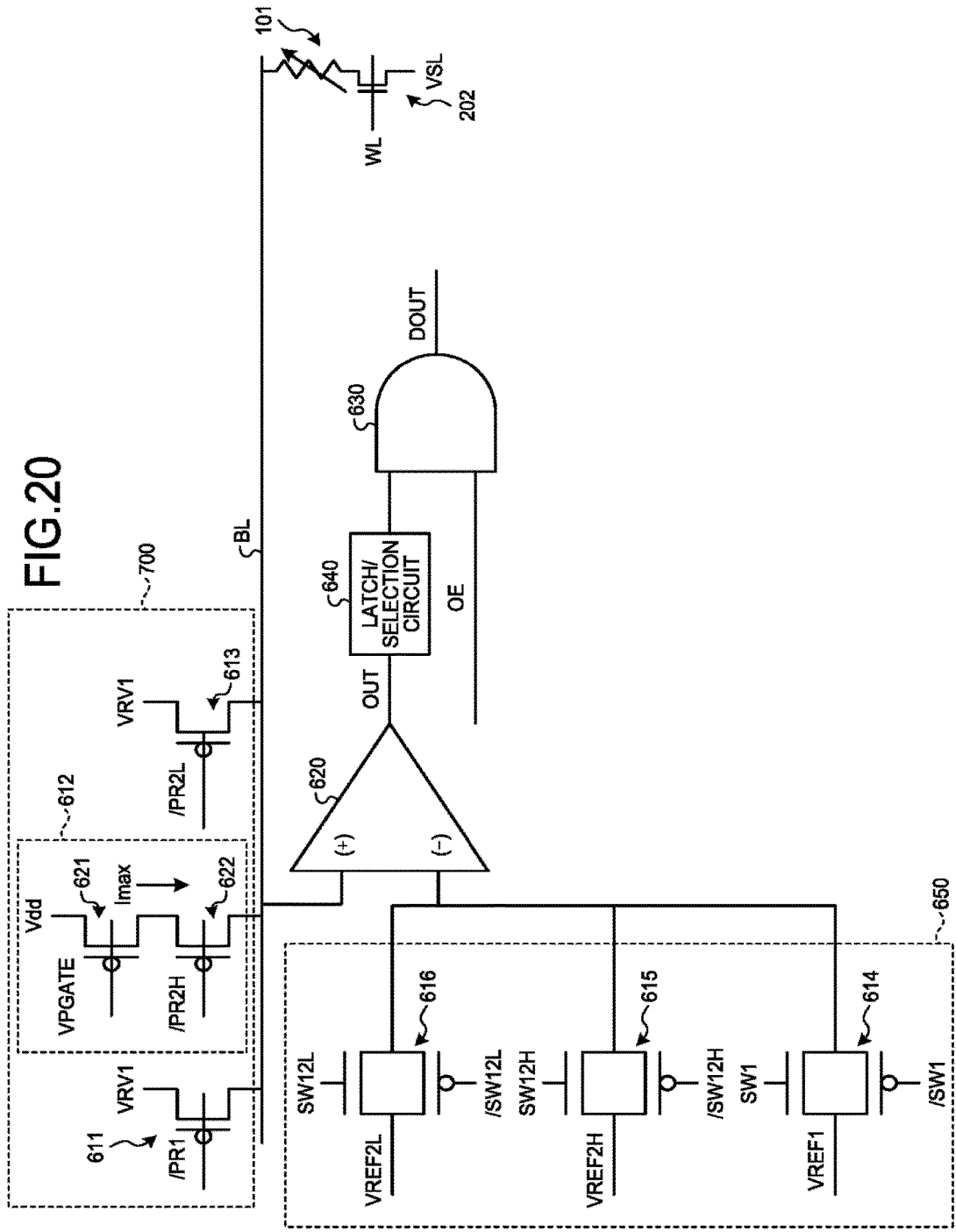
FIG. 20 is a diagram illustrating the circuit configuration of a read unit of the third embodiment.

FIG. 20 is a diagram illustrating an example configuration of a circuit for providing the function of selecting a reference voltage, a constant voltage, and a constant current from among the functions of the read unit 400 of the present embodiment. As shown in FIG. 20, the read unit 400 comprises at least a constant-voltage/constant-current supply unit 700, an operational amplifier 620, an AND circuit 630, a latch/selection circuit 640, and a reference voltage supply unit 650.

The constant-voltage/constant-current supply unit 700 is a circuit to supply a constant voltage or a constant current to the bit line BL. In the example of FIG. 20, the constant-voltage/constant-current supply unit 700 includes a transistor 611, a constant current source 612, and a transistor 613. The transistor 611 switches between applying the first constant voltage VRV1 to the bit line BL and not applying and switches on/off according to the signal /PR1 inputted to its gate. In this example, the transistor 611 transitions to the ON state when the signal /PR1 goes low and transitions to the OFF state when the signal /PR1 goes high.

The constant current source 612 is a circuit to supply a constant current (here the above maximum current Imax) to the bit line BL and includes transistors 621, 622. The transistor 621 is a current source transistor to generate a constant current from a power supply voltage Vdd to flow. The transistor 622 switches between applying the constant current generated by the transistor 621 to the bit line BL and not applying and switches on/off according to the signal /PR2H inputted to its gate. In this example, the transistor 622 transitions to the ON state when the signal /PR2H goes low and transitions to the OFF state when the signal /PR2H goes high.

The transistor 613 switches between applying the first constant voltage VRV1 to the bit line BL and not applying and switches on/off according to the signal /PR2L inputted to its gate. In this example, the transistor 613 transitions to the ON state when the signal /PR2L goes low and transitions to the OFF state when the signal /PR2L goes high.

Note that the signal levels (H/L) of the signals /PR1, /PR2H, and /PR2L are controlled by the read unit 400.

The operational amplifier 620 outputs the result of comparing the voltage on the bit line BL and a reference voltage. In this example, the voltage on the bit line BL is inputted to the positive input side (non-inverting amplification terminal) of the operational amplifier 620, and the reference voltage is inputted to the negative input side (inverting amplification terminal). The output OUT of the operational amplifier 620 is inputted to the AND circuit 630 via the latch/selection circuit 640. The OE is inputted to the AND circuit 630 as in the above embodiments, and while the signal level of the OE is high, the AND circuit 630 outputs an output DOUT.

The latch/selection circuit 640 latches the output OUT of the operational amplifier 620 and selects the next reference voltage and the next constant voltage or constant current according to the output OUT. The specific configuration will be described later.

The reference voltage supply unit 650 supplies a reference voltage to the negative input side (inverting amplification terminal) of the operational amplifier 620 and includes switching elements (complementary switches) 614, 615, 616. The switching element 614 corresponds to the switching element 451 shown in FIG. 7; the switching element 615 corresponds to the switching element 452 shown in FIG. 7; and the switching element 616 corresponds to the switching element 453 shown in FIG. 7.

Figure 21:
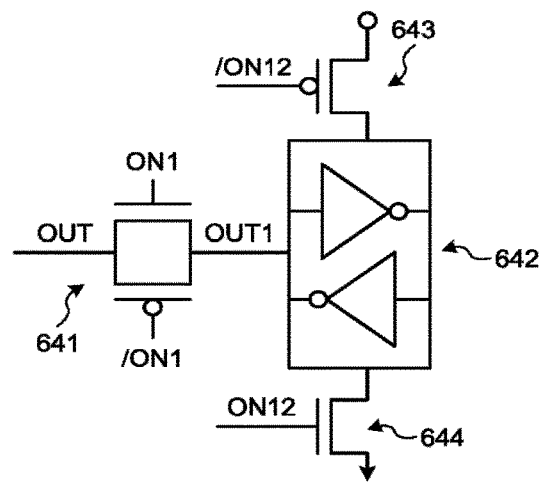
FIG. 21 is a diagram illustrating the configuration of a latch/selection circuit of the third embodiment.

Next, the configuration of the latch/selection circuit 640 will be described with reference to FIGS. 21 and 22. FIG. 21 is a diagram illustrating an example configuration of a circuit for providing the function of latching the above-mentioned output OUT from the operational amplifier 620 from among the functions of the latch/selection circuit 640. The latch/selection circuit 640 comprises a switching element 641 and a latch circuit 642. This configuration is the same as that shown in FIG. 8; the switching element 641 corresponds to the switching element 441 shown in FIG. 8; and the latch circuit 642 corresponds to the latch circuit 442 shown in FIG. 8. Transistors 643, 644 included in the latch circuit 642 respectively correspond to the transistors 443, 444 shown in FIG. 8. Detailed description is omitted from here.

Figure 22:
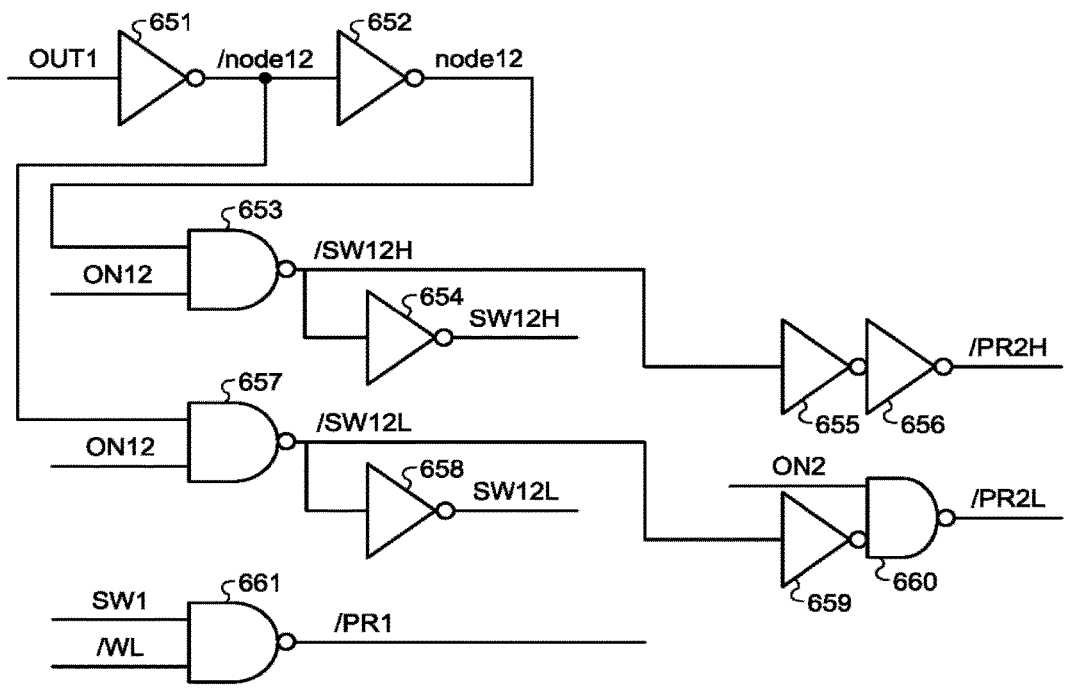
FIG. 22 is a diagram illustrating the configuration of the latch/selection circuit of the third embodiment.
Figure 23:
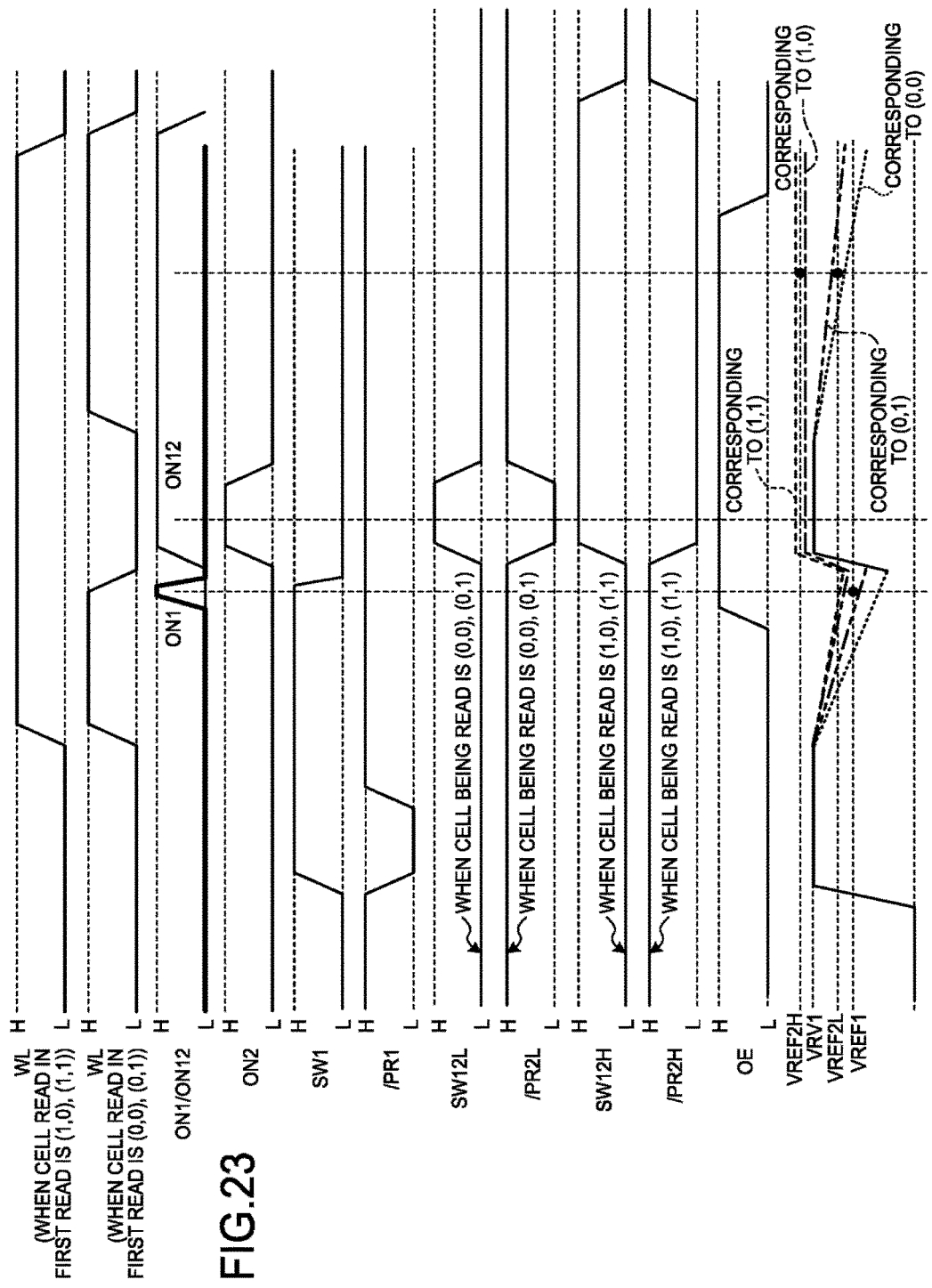
FIG. 23 is a timing chart for explaining the operation of the read unit of the third embodiment.

FIG. 22 is a diagram illustrating an example configuration of a circuit (hereinafter may be called a selection circuit) for providing the function of selecting a reference voltage and a constant voltage or a constant current from among the functions of the latch/selection circuit 640. As shown in FIG. 22, the latch/selection circuit 640 (the selection circuit) comprises an inverter 651, an inverter 652, a NAND circuit 653, an inverter 654, an inverter 655, an inverter 656, a NAND circuit 657, an inverter 658, an inverter 659, and a NAND circuit 660. Further, the latch/selection circuit 640 comprises a NAND circuit 661. The signals SW1 and /WL are inputted to the NAND circuit 661, and only if SW1 and /WL are high, a signal /PR1 outputted from the NAND circuit 661 is low.

An output OUT1 from the operational amplifier 620 via the switching element 641 in the ON state is inputted to the inverter 651. A signal /node12 that is the output OUT1 inverted by the inverter 651 is inputted to the inverter 652 and to the NAND circuit 657.

An inverted signal node12 outputted by the inverter 652 is inputted to the NAND circuit 653. The signal ON12 is also inputted to the NAND circuit 653, and when the signal ON12 is high and the signal node12 is high, a signal /SW12H outputted from the NAND circuit 653 is at a non-active level (low), and otherwise the signal /SW12H is at an active level (high). The signal /SW12H is inputted to the inverter 654. The signal /SW12H is inverted by the inverter 654 and outputted as a signal SW12H. Also the signal /SW12H is inputted to the inverter 655. The signal inverted by the inverter 655 is again inverted by the inverter 656 and outputted as a signal /PR2H.

Meanwhile, the signal ON12 is also inputted to the NAND circuit 657 having the above-mentioned signal /node12 inputted thereto, and when the signal ON12 is high and the signal /node12 is high, a signal /SW12L outputted from the NAND circuit 657 is low, and otherwise the signal /SW12L is high. The signal /SW12L is inputted to the inverter 658. The signal /SW12L is inverted by the inverter 658 and outputted as a signal SW12L. Also the signal /SW12L is inputted to the inverter 659. The signal inverted by the inverter 659 is inputted to the NAND circuit 660. The signal ON2 is also inputted to the NAND circuit 660, which takes a NAND logic thereof to output a signal /PR2L.

For example, suppose that in the first read, when the first constant voltage VRV1 is selected as the constant voltage, and the first reference voltage VREF1 is selected as the reference voltage, the output OUT of the operational amplifier 620 is low. That is, suppose that the first reference voltage VREF1 is higher than the voltage on the bit line BL when reading after applying the first constant voltage VRV1. In this case, with the circuits of FIGS. 21 and 22, the signal SW12L is high; the signal /PR2L is low; the signal SW12H is low; and the signal /PR2H is high, so that the first reference voltage VREF1 is selected as the reference voltage and that the third constant voltage VRV2L is selected as the constant voltage.

In contrast, for example, suppose that the output OUT of the operational amplifier 620 is high, that is, the first reference voltage VREF1 is lower than the voltage on the bit line BL when reading after applying the first constant voltage VRV1. In this case, with the circuits of FIGS. 21 and 22, the signal SW12L is low; the signal /PR2L is high; the signal SW12H is high; and the signal /PR2H is low, so that the second reference voltage VREF2H is selected as the reference voltage and that the maximum current Imax is applied as the constant current to perform the read.

FIG. 23 is a diagram illustrating an example timing chart when the read unit 400 controls various signals to select a reference voltage and a constant voltage or a constant current in reading data from the selected storage element 101. In this example, the premise is that the bit line BL connected to the storage element 101 to be selected is already selected.

As shown in FIG. 23, first, the read unit 400 controls the signal SW1 to be high and the signal /PR1 to be low. Thus, the transistor 611 and the switching element 614 transition to the ON state, so that the first constant voltage VRV1 is selected as the constant voltage to be applied to the bit line BL connected to the storage element 101 to be selected and that the first reference voltage VREF1 is selected as the reference voltage to be inputted to the negative input side (inverting amplification terminal) of the operational amplifier 620.

Then the read unit 400 selects the word line WL connected to the storage element 101 to be selected. Specifically, the signal supplied to the gate of the selection transistor 201 of the word line WL connected to the storage element 101 to be selected is caused to go low, so that the selection transistor 201 transitions to the ON state. Thus, the bit line BL having had the first constant voltage VRV1 applied thereto (the bit line BL connected to the selected storage element 101) switches from the floating state to being connected to the low potential power supply line VSL via the storage element 101, so that the voltage on the bit line BL fails from the first constant voltage VRV1 correspondingly to the resistance state of the selected storage element 101. FIG. 23 shows the way that the voltage on the bit line BL falls for each of the resistance states (1, 1), (1, 0), (0, 1), (0, 0) of the storage element 101.

After the time when the voltage on the bit line BL is compared with the first reference voltage VREF1 has passed, the read unit 400 outputs the comparing result of the operational amplifier 620 and controls the signal ON1 to be high for a predetermined period. By this means, the switching element 641 transitions to the ON state, so that the output OUT of the operational amplifier 620 is inputted to the latch circuit and, subsequently when the signal ON12 goes high, is latched and inputted to the selection circuit.

As above, if the output OUT of the operational amplifier 620 is low, the signal SW12L is high; the signal /PR2L is low; the signal SW12H is low; and the signal /PR2H is high, so that the third reference voltage VREF2L is selected as the reference voltage and that the first constant voltage VRV1 is again selected as the constant voltage. In response to the output OUT of the operational amplifier 620 being low, the read unit 400 controls the WL to be temporarily low. Thus, the word line WL connected to the selected storage element 101 is again rendered non-selected. Then the read unit 400 controls the signal /PR2L to go low in order to precharge the bit line BL. As shown in FIGS. 22, 23, the signal /PR2L is low only while the signal ON2 is high, so that the bit line BL is precharged. Thus, the bit line BL again precharged to the first constant voltage VRV1 switches from the floating state to being connected to the low potential power supply line VSL via the storage element 101. The voltage on the bit line BL again precharged to the first constant voltage VRV1 falls correspondingly to the resistance state of the selected storage element 101, (0, 1), (0, 0). The example of FIG. 23 shows the way that the voltage on the bit line BL falls for each of the resistance states (0, 1), (0, 0) of the storage element 101.

In contrast, if the output OPT of the operational amplifier 620 is high, the signal SW12L is low; the signal /PR2L is high; the signal SW12H is high; and the signal /PR2H is low, so that the second reference voltage VREF2H is applied as the reference voltage and that the maximum current Imax is applied as the constant current. The voltage on the bit line BL having the maximum current Imax applied thereto is determined as the voltage at which the discharge amount depending on the resistance state of the storage element 101 and the supplied maximum current Imax are in balance. The example of FIG. 23 shows the voltage on the bit line BL for each of the resistance states (1, 1), (1, 0) of the storage element 101.

Then the read unit 400 determines the resistance value of the storage element 101 according to the comparing result of the operational amplifier 620.

As described above, the present embodiment adopts the method which applies a constant current to read when determining which of the two upper states (1, 1), (1, 0) the resistance state of the storage element 101 is. By this means, the voltage fall on the bit line BL can be suppressed as compared with the case where a constant voltage is applied to read in determination of the upper states (1, 1), (1, 0) as in the above embodiments, and therefore enough margins between multiple reference voltages (e.g., the margin between the first reference voltage VREF1 and the second reference voltage VREF2H) can be secured, so that this embodiment has the advantage of more easily determining.

Fourth Embodiment

Next, a fourth embodiment will be described. Description of the same parts as in the above third embodiment is omitted as needed. The present embodiment differs from the third embodiment in that, if in the first read it is determined that the resistance state of the storage element 101 is one of the two lower resistance states, (0, 1) or (0, 0), temporarily rendering the word line WL closed to supply a constant voltage again is not performed. The specific contents thereof will be described below.

Also in the present embodiment, the read unit 400 reads the data of the storage element 101 while switching between the constant voltage read method which applies a constant voltage to read the data of the storage element 101 and the constant current read method which applies a constant current to read the data of the storage element 101. More specifically, the read unit 400 switches from the constant voltage read method to the constant current read method so as to read the data of the storage element 101. As in the above third embodiment, the read unit 400 reads the data of the storage element. 101 while selecting one of multiple reference voltages corresponding to multiple (here three) threshold resistances ($R_{th1}$, $R_{th2}$, $R_{th3}$) to determine which of multiple resistance states the data of the storage element 101 is and selects the next reference voltage and the next constant voltage or constant current to read, according to the result of comparing the first reference voltage VREF1 that is the reference voltage selected first and the voltage when reading after applying the first constant voltage VRV1 that is the constant voltage selected first to the bit line BL for supplying a voltage to the storage element 101.

Figure 24:
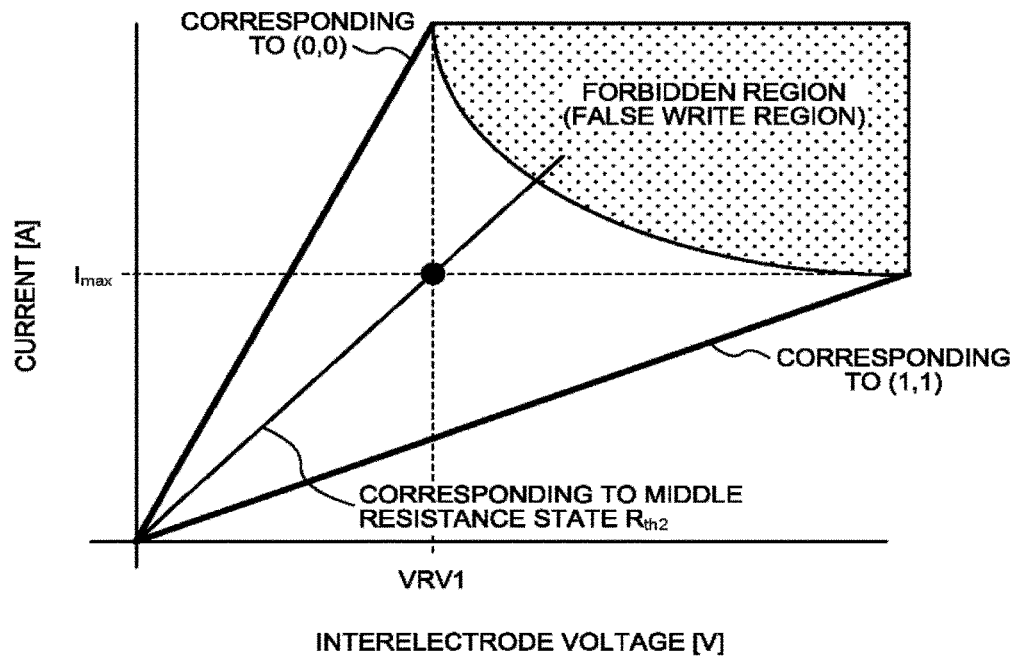
FIG. 24 is a graph illustrating the operation points of the storage element corresponding to a threshold resistance of a fourth embodiment.
Figure 25:
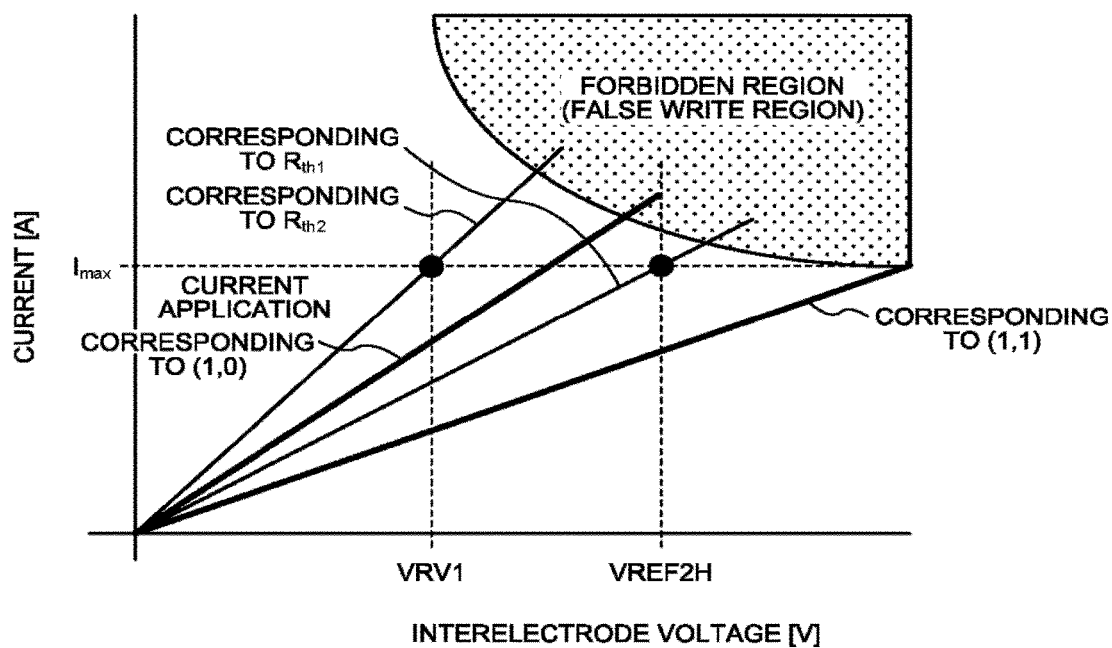
FIG. 25 is a graph illustrating the operation points of the storage element corresponding to threshold resistances of the fourth embodiment.
Figure 26:
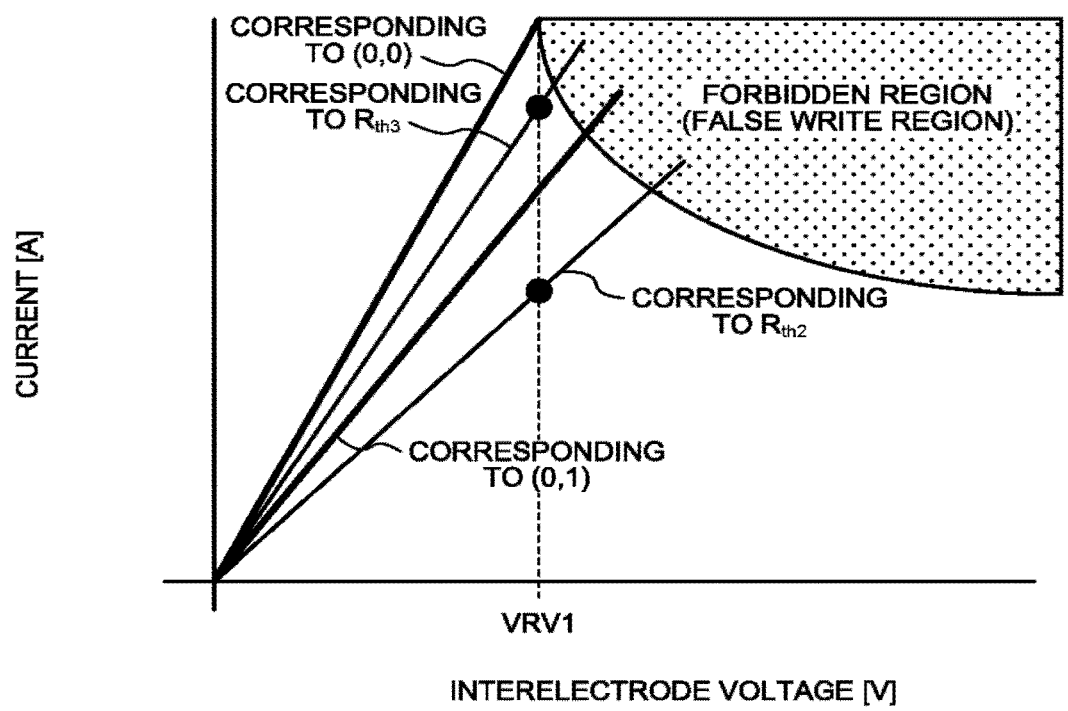
FIG. 26 is a graph illustrating the operation points of the storage element corresponding to threshold resistances of the fourth embodiment.

The specific contents of the fourth embodiment will be described with reference to FIGS. 24 to 29. First, with the word line WL connected to a storage element 101 to be read from being non-selected (a floating state), the first constant voltage VRV1 is applied to the bit line connected to that storage element 101. As shown in FIG. 24, this first constant voltage VRV1 is a maximum voltage among the voltages outside the forbidden region (false write region). Further, herein a maximum current among the currents outside the forbidden region is called Imax. The straight line corresponding to the above threshold resistance $R_{th2}$ passes through the intersection of the straight line of Imax and the straight line of VRV1. That is, the first constant voltage VRV1 selected first is a maximum voltage at which to be able to avoid the forbidden region, and the intersection of this maximum voltage and the maximum current Imax at which to be able to avoid the forbidden region corresponds to the middle threshold resistance $R_{th2}$ from among the multiple threshold resistances. As shown in FIGS. 25 and 26, the straight line of this threshold resistance $R_{th2}$ (the straight line joining the above intersection and the origin) is located at the middle between (0, 1) and (1, 0). In the first read, it is determined whether the resistance state of the storage element 101 is among the two upper resistance states or the two lower resistance states out of the four resistance states. As shown in FIGS. 24 and 29, after the first constant voltage VRV1 is applied when in the floating state with the word line WL being non-selected, the word line WL is selected, so that the voltage on the bit line BL falls and is compared with the first reference voltage VREF1. Here, the setting is made such that, at the time of the first sensing (first read) (the time that the potential on the bit line BL falls to become lower than the reference potential of the operational amplifier), if the resistance value of the storage element 101 is at $R_{th2}$, the voltage on the bit line BL coincides with the first reference voltage VREF1.

The read unit 400, first, selects the first reference voltage VREF1 and the first constant voltage VRV1 as above and, if the voltage on the bit line BL when reading after applying the first constant voltage VRV1 exceeds the first reference voltage VREF1, selects the second reference voltage VREF2H, higher than the first reference voltage VREF1, as the reference voltage corresponding to the threshold resistance $R_{th1}$ higher by one step than the middle threshold resistance $R_{th2}$ and applies the maximum current Imax as the constant current so as to read. Here, the setting is made such that the operation point of the storage element 101 when reading while applying the maximum current Imax avoids the forbidden region. As shown in FIG. 25, the second reference voltage VREF2H and the maximum current Imax are set such that the operation point of the storage element 101 defined by the second reference voltage VRFE2H and the maximum current Imax avoids the forbidden region and corresponds to the threshold resistance $R_{th1}$ higher by one step than the middle threshold resistance $R_{th2}$.

The read unit 400 first selects the first reference voltage VREF1 and the first constant voltage VRV1 as above and, if the voltage on the bit line BL when reading after applying the first constant voltage VRV1 is smaller than the first reference voltage VREF1, selects the third reference voltage VREF2L, lower than the first reference voltage VREF1, as the reference voltage corresponding to the threshold resistance $R_{th3}$ lower by one step than the middle threshold resistance $R_{th2}$ and, subsequently without selecting another constant voltage, performs the second read. Here, the setting is made such that the operation points of the storage element 101 when reading after applying the first constant voltage VRV1 avoid the forbidden region.

Figure 27:
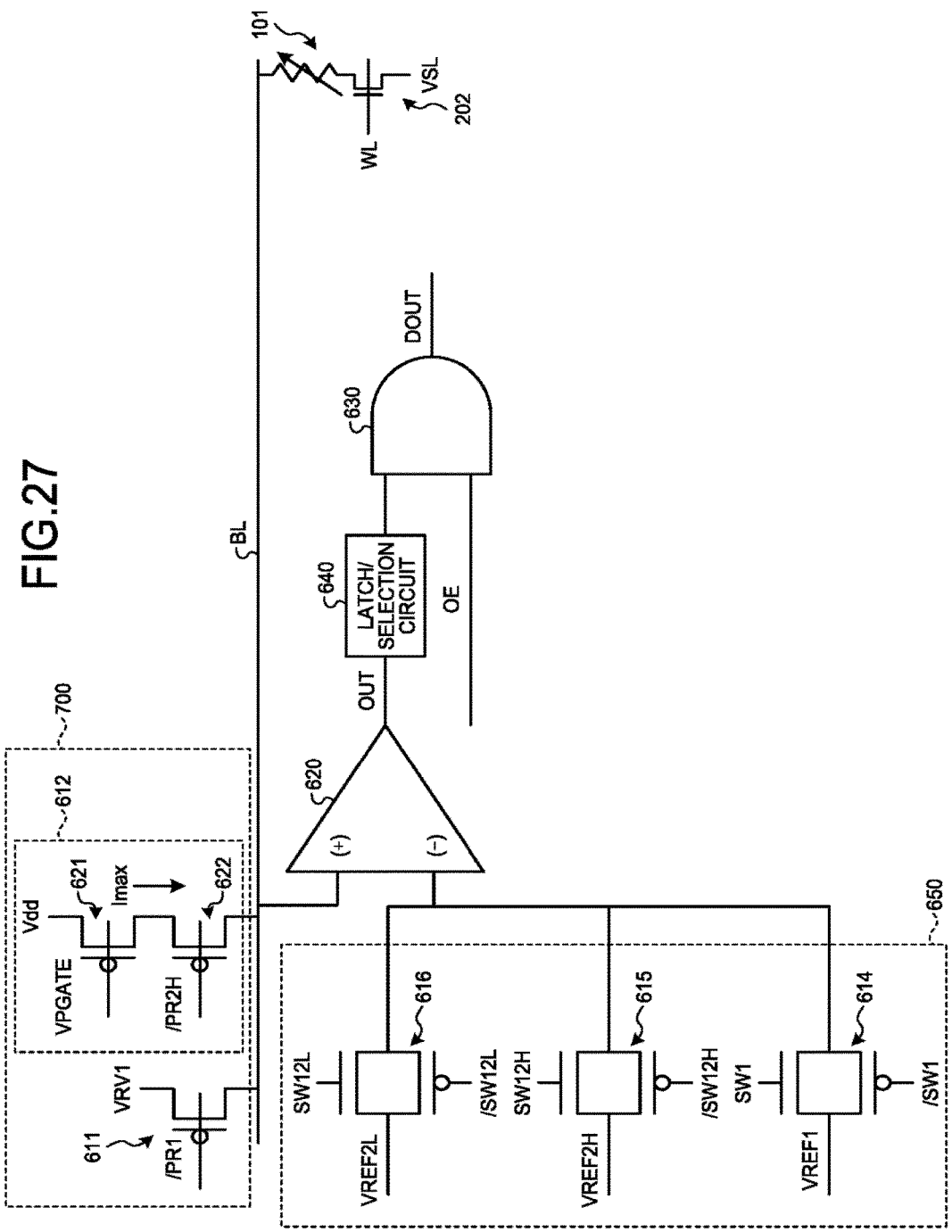
FIG. 27 is a diagram illustrating the circuit configuration of a read unit of the fourth embodiment.

FIG. 27 is a diagram illustrating an example configuration of a circuit for providing the function of selecting a reference voltage and a constant voltage or a constant current from among the functions of the read unit 400. As shown in FIG. 27, the constant-voltage/constant-current supply unit 700 is different than in the third embodiment in that it includes a transistor 611 and a constant current source 612 but not a transistor 613.

Although the configuration of the selection circuit of the latch/selection circuit 640 is different than in the above third embodiment as described later, the other configuration is the same as in the third embodiment.

Figure 28:
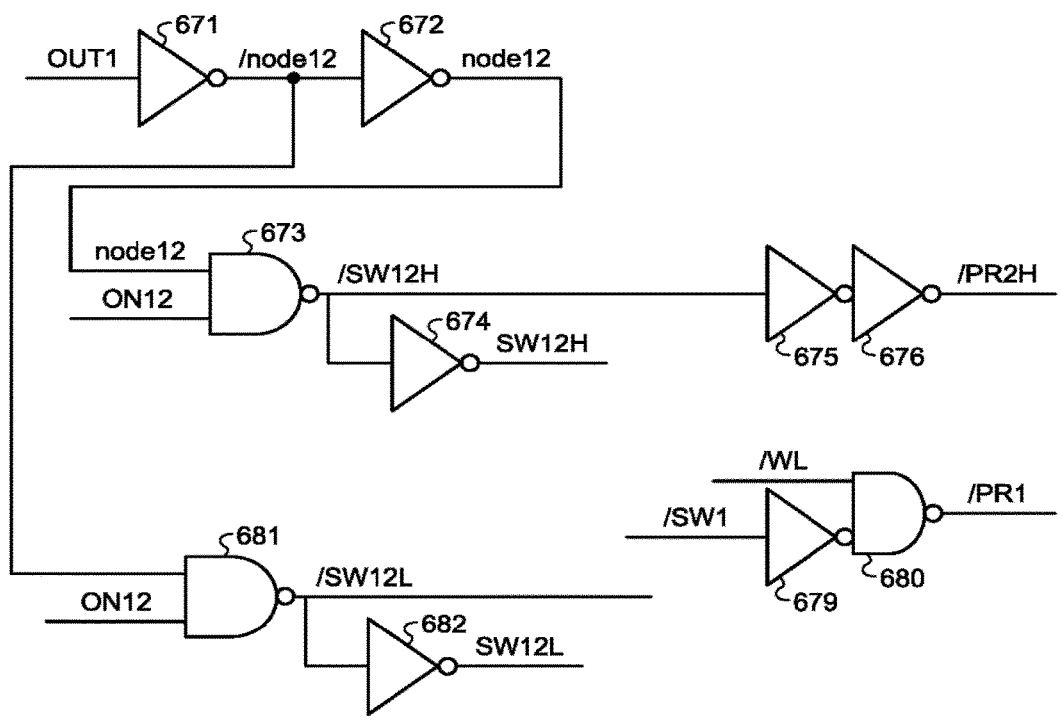
FIG. 28 is a diagram illustrating the configuration of a latch/selection circuit of the fourth embodiment.
Figure 29:
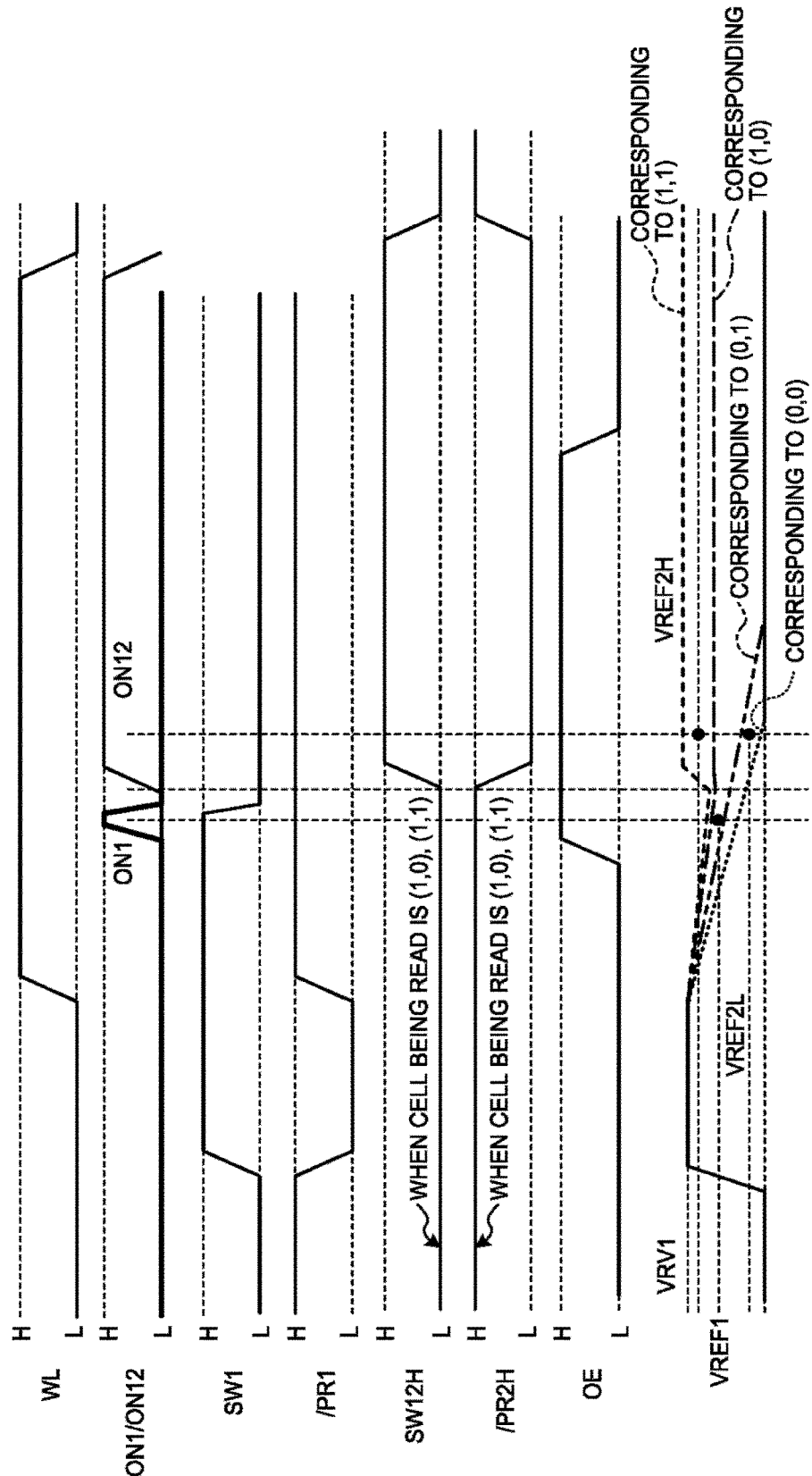
FIG. 29 is a timing chart for explaining the operation of the read unit of the fourth embodiment.

FIG. 28 is a diagram illustrating an example configuration of the selection circuit the present embodiment. As shown in FIG. 28, the selection circuit comprises an inverter 671, an inverter 672, a NAND circuit 673, an inverter 674, an inverter 675, an inverter 676, an inverter 679, a NAND circuit 680, a NAND circuit 681, and an inverter 682.

The above-mentioned output OUT1 from the operational amplifier 620 through the switching element 641 is inputted to the inverter 671. A signal /node12 generated by the inverter 671 inverting the Gull is inputted to the inverter 672. A signal node12 generated by the inverter 672 inverting the signal /node12 is inputted to the NAND circuit 673. The signal ON12 is also inputted to the NAND circuit 673, and when the signal ON12 is high and the signal node12 is high, a signal /SW12H outputted from the NAND circuit 673 is low, and otherwise the signal /SW12H is high. The signal /SW12H is inputted to the inverter 674. The signal /SW12H is inverted by the inverter 674 and outputted as a signal SW12H. Also, the signal /SW12H is inputted to the inverter 675. The signal inverted by the inverter 675 is again inverted by the inverter 676 and outputted as a signal /PR2H. The signal /node12 and the signal ON12 are inputted to the NAND circuit 681 shown in FIG. 28, which takes a NAND logic thereof to output a signal /SW12L. The signal /SW12L is inverted by the inverter 682 and outputted as a signal SW12L.

A signal /SW1 that is the inverted signal of the signal SW1 is inputted to the inverter 679 shown in FIG. 28. The signal /SW1 inverted by the inverter 679 is inputted to the NAND circuit 680, which takes a NAND logic of that input and the inverted signal /WL of the WL to output a signal /PR1.

For example, suppose that in the first read, when the first constant voltage VRV1 is selected as the constant voltage, and the first reference voltage VREF1 is selected as the reference voltage, the output OUT of the operational amplifier 620 is low. That is, suppose that the first reference voltage VREF1 is higher than the voltage on the bit line BL when reading after applying the first constant voltage VRV1. In this case, with the circuits of FIGS. 21 and 28, the signal SW12L is high and the signal SW12H is low, so that the third reference voltage VREF2L is selected as the reference voltage. At this time, the signal /PR2H and the signal /PR1 are high, so that no constant voltage or constant current is selected in the second read, which will be described in detail later.

In contrast, for example, suppose that the output OUT of the operational amplifier 620 is high, that is, the first reference voltage VREF1 is lower than the voltage on the bit line BL corresponding to the resistance state of the storage element 101. In this case, with the circuits of FIGS. 21 and 28, the signal SW12L is low, and the signal SW12H is high, so that the second reference voltage VREF2H is selected as the reference voltage. At this time, the signal /PR2H is low, and the signal /PR1 is high, so that in the second read unlike the first read, the maximum current Imax is selected as the constant current to perform the read.

FIG. 29 is a diagram illustrating an example timing chart when the read unit 400 controls various signals to select a reference voltage and a constant voltage or a constant current in reading data from the selected storage element 101. In this example, the premise is that the bit line BL connected to the storage element 101 to be selected is already selected.

As shown in FIG. 29, first, the read unit 400 controls the signal SW1 to be high for a predetermined period and the signal /PR1 to be low for a predetermined period. Thus, the transistor 611 and the switching element 614 transition to the ON state, so that the first constant voltage VRV1 is selected as the constant voltage to be applied to the bit line BL connected to the storage element 101 to be selected and that the first reference voltage VREF1 is selected as the reference voltage to be inputted to the negative input side (inverting amplification terminal) of the operational amplifier 620.

Then the read unit 400 selects the word line WL connected to the storage element 101 to be selected. Specifically, the signal supplied to the gate of the selection transistor 201 of the word line WL connected to the storage element 101 to be selected is caused to go low, so that the selection transistor 201 transitions to the ON state. Thus, the precharged bit line BL switches from the floating state to being connected to the low potential power supply line VSL via the storage element 101, so that the voltage on the bit line BL fails from the first constant voltage VRV1 correspondingly to the resistance state of the selected storage element 101. FIG. 29 shows the way that the voltage on the bit line BL falls for each of the resistance states (1, 1), (1, 0), (0, 1), (0, 0) of the storage element 101.

After the time has elapsed from when in the floating state to when the voltage on the bit line BL is compared with the first reference voltage VREF1, the read unit 400 controls the signal ON1 to be high for a predetermined period while outputting the comparing result of the operational amplifier 620. By this means, the switching element 641 transitions to the ON state, so that the output OUT of the operational amplifier 620 is inputted to the latch circuit.

As above, if the output OUT of the operational amplifier 620 is low, the signal SW12L is high, and the signal SW12H is low, so that the third reference voltage VREF2L is selected as the reference voltage. At this time, the signal /PR2H is high. Further, at this time, the read unit 400 keeps the signal SW1 low, so that the signal /PRI is high. Thus, no constant voltage or constant current is selected. In this case, the bit line BL is not again precharged, and the WL continues to be kept low. After time until the voltage on the bit line BL is compared with a reference voltage (the third reference voltage VREF2L) has elapsed, the read unit 400 determines the resistance value of the storage element 101 according to the comparing result of the operational amplifier 620.

In contrast, if the output OUT of the operational amplifier 620 is high, the signal SW12L is low, and the signal SW12H is high, so that the second reference voltage VREF2H is selected as the reference voltage. At this time, the signal /PR2H is low, and the signal /PR1 is high, so that the maximum current Imax is selected as the constant current. In this case, the voltage on the bit line BL having the maximum current Imax applied thereto is determined as the voltage at which the discharge amount depending on the resistance state of the storage element 101 and the supplied maximum current Imax are in balance. The example of FIG. 29 shows the voltage on the bit line BL for each of the resistance states (1, 1), (1, 0) of the storage element 101. The read unit 400 determines the resistance value of the storage element 101 according to the comparing result of the operational amplifier 620.

Fifth Embodiment

Next, a fifth embodiment will be described. Description of the same parts as in the above embodiments is omitted as needed. The present embodiment differs from the above embodiments in that the read unit 400, selecting one at a time, applies multiple types of constant currents to the storage element 101 in reading the data of the storage element 101. The read unit 400 of the present embodiment supplies a constant current so as to perform a read, avoiding the forbidden region that is a set of phase transition points indicating operation points at which a phase transition occurs in the storage element 101. A specific description will be made below.

The read unit 400 reads the data of the storage element 101 while selecting one of multiple reference voltages corresponding to multiple (here three) threshold resistances ($R_{th1}$, $R_{th2}$, $R_{th3}$) to determine which of multiple resistance states the data of the storage element 101 selected to be read from is and selects the next reference voltage and the next constant current to read, according to the result of comparing the first reference voltage VREF1 that the reference voltage selected first and the voltage when reading while applying a first constant current Imax that is the constant current selected first to the bit line BL for supplying a current/voltage to the storage element 101.

Figure 30:
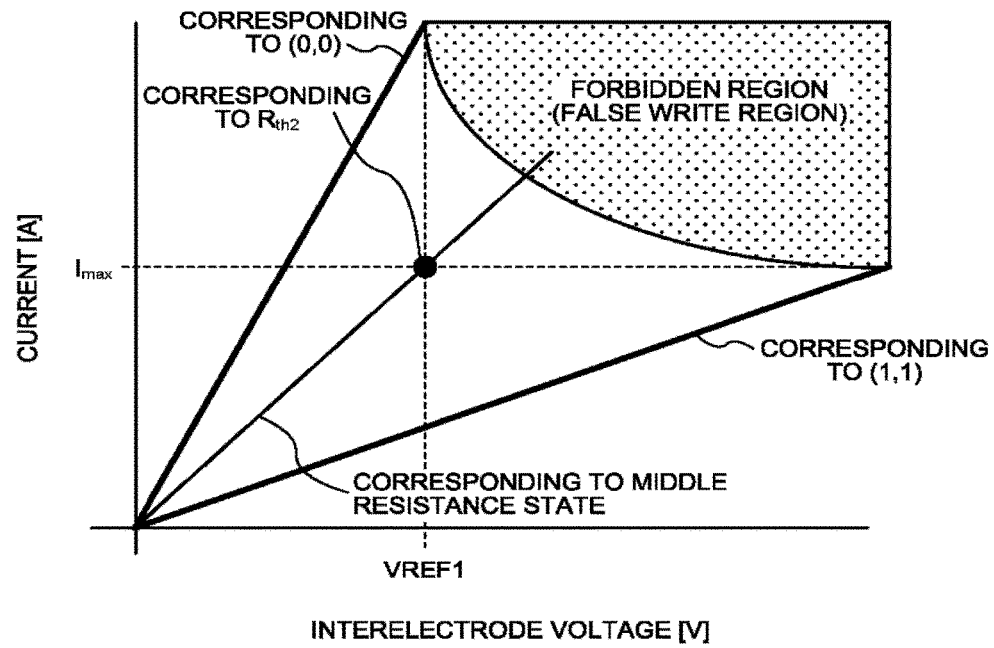
FIG. 30 is a graph illustrating the operation points of the storage element corresponding to a threshold resistance of a fifth embodiment.
Figure 31:
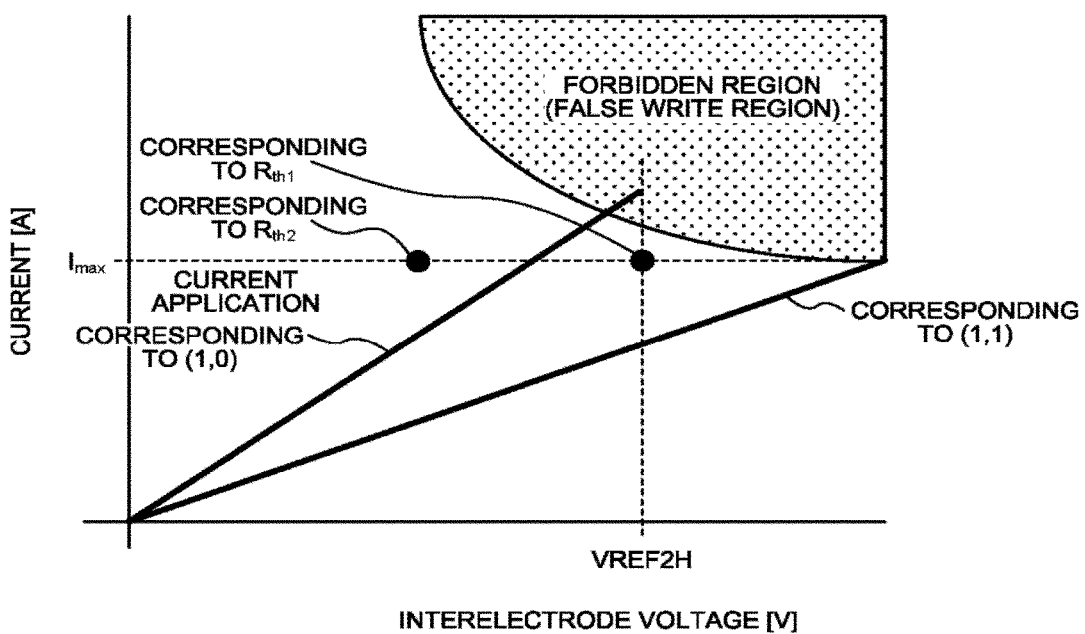
FIG. 31 is a graph illustrating the operation points of the storage element corresponding to threshold resistances of the fifth embodiment.
Figure 32:
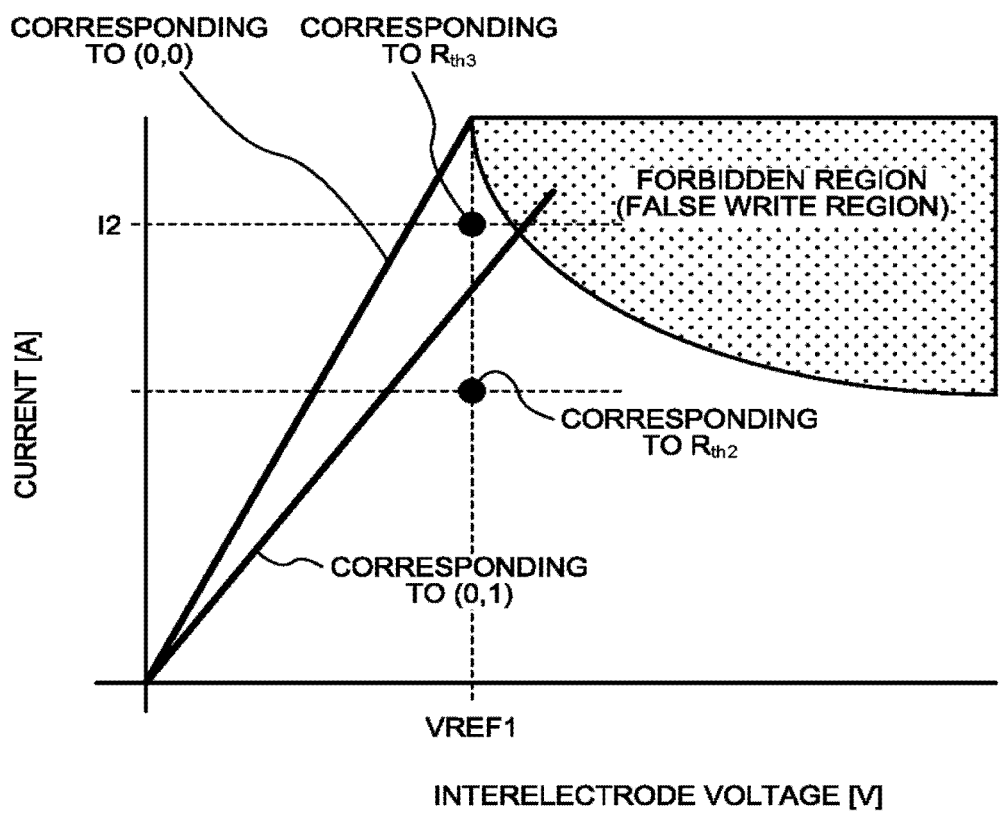
FIG. 32 is a graph illustrating the operation points of the storage element corresponding to threshold resistances of the fifth embodiment.
Figure 36:
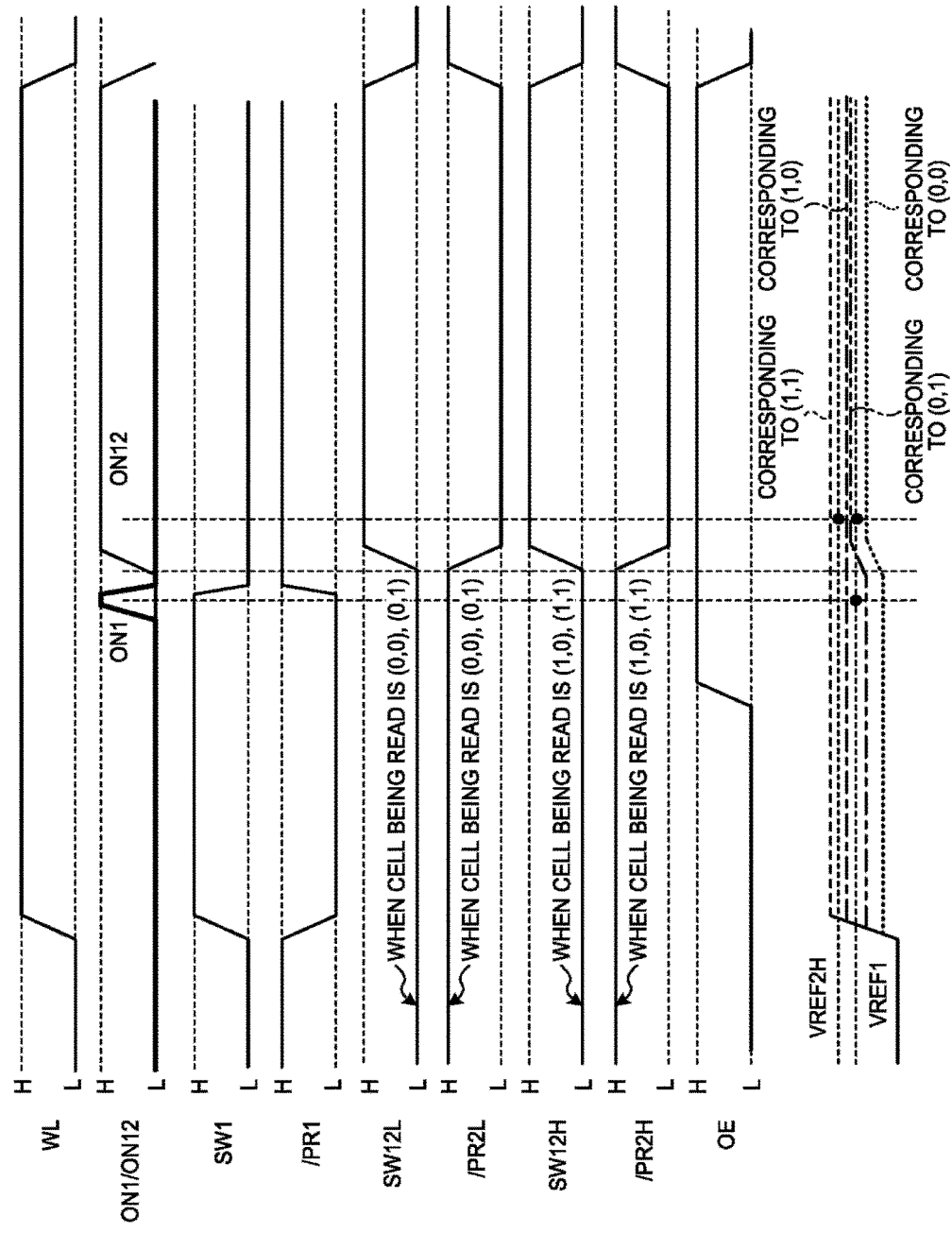
FIG. 36 is a timing chart for explaining the operation of the read unit of the fifth embodiment.

The first-selected first reference voltage VREF1 corresponds to the middle threshold resistance $R_{th2}$ from among the multiple threshold resistances ($R_{th1}$, $R_{th2}$, $R_{th3}$). As shown in FIG. 30, this first reference voltage VREF1 is a maximum voltage among the voltages outside the forbidden region. Further, herein a maximum current among the currents outside the forbidden region is called Imax (the first constant current Imax). The straight line corresponding to the above threshold resistance $R_{th2}$ passes through the intersection of the straight line of Imax and the straight line of VRV1. As shown in FIGS. 31 and 32, the straight line of this threshold resistance $R_{th2}$ (the straight line joining the above intersection and the origin) is located at the middle between (0, 1) and (1, 0). In the first read, it is determined whether the resistance state of the storage element 101 is among the two upper resistance states or the two lower resistance states out of the four resistance states. As shown in FIGS. 30 and 36, the current Imax is supplied when in the floating state with the word line WL, being non-selected, and the voltage on the bit line BL is compared with the first reference voltage VREF1.

The read unit 400 first selects the first reference voltage VREF1 and the first constant current Imax as above, and if the voltage on the bit line BL when reading while applying the first constant current Imax exceeds the first reference voltage VREF1, selects the second reference voltage VREF2H higher than the first reference voltage VREF1 as the reference voltage corresponding to the threshold resistance $R_{th1}$ higher by one step than the middle threshold resistance $R_{th2}$ to perform the read with the first constant current Imax remaining as the constant current. Here, the setting is made such that the operation point of the storage element 101 when reading while applying the first constant current Imax avoids the forbidden region.

The read unit 400 first selects the first reference voltage VREF1 and the first constant current Imax as above, and if the voltage on the bit line BL when reading while applying the first constant current Imax is smaller than the first reference voltage VREF1, selects the first reference voltage VREF1 as the reference voltage corresponding to the threshold resistance $R_{th3}$ lower by one step than the middle threshold resistance $R_{th2}$ and selects a second constant current I2 greater than the first constant current Imax as the constant current to perform the read. Here, the setting is made such that the operation point of the storage element 101 when reading while applying the second constant current I2 avoids the forbidden region.

Figure 33:
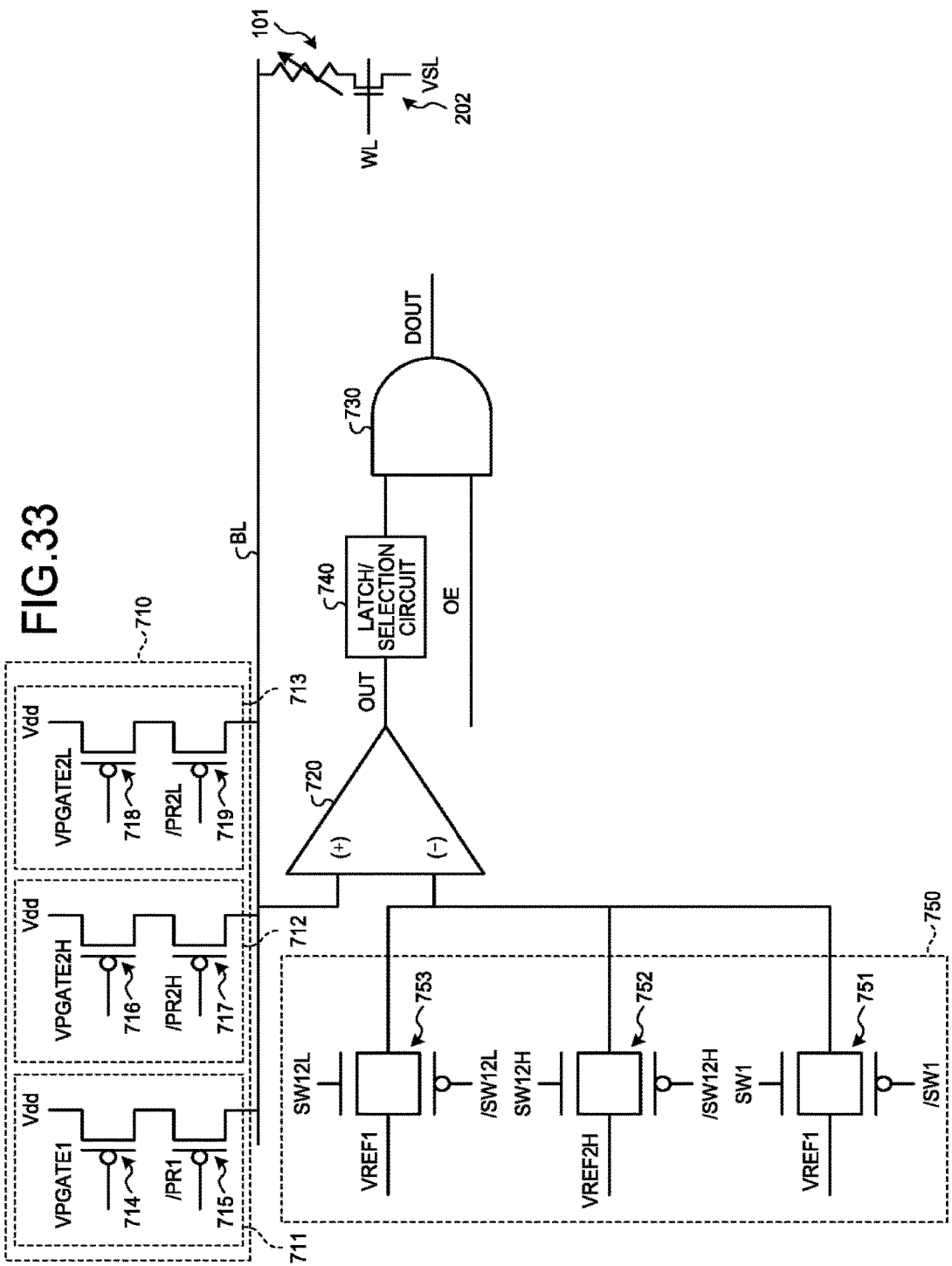
FIG. 33 is a diagram illustrating the circuit configuration of a read unit of the fifth embodiment.

FIG. 33 is a diagram illustrating an example configuration of a circuit for providing the function of selecting a reference voltage and a constant current from among the functions of the read unit 400 of the present embodiment. As shown in FIG. 33, the read unit 400 comprises at least a constant current supply unit 710, an operational amplifier 720, an AND circuit 730, a latch/selection circuit 740, and a reference voltage supply unit 750.

The constant current supply unit 710 is a circuit to supply a constant current to the bit line BL. In the example of FIG. 33, the constant current supply unit 710 includes constant current sources 711, 712, 713.

The constant current source 711 is a circuit to supply a first constant current I1 to the bit line BL and includes transistors 714, 715. The transistor 714 is a current source transistor to generate the first constant current I1 from a power supply voltage Vdd to flow. The transistor 715 switches between applying the first constant current I1 generated by the transistor 714 to the bit line BL and not applying and switches on/off according to the signal /PR1 inputted to its gate. In this example, the transistor 715 transitions to the ON state when the signal /PR1 goes low and transitions to the OFF state when the signal /PR1 goes high. Note that the signal level (H/L) of the signal /PR1 is controlled by the read unit 400. In other words, the read unit 400 also has the function of controlling the signal level of the signal /PR1.

The constant current source 712 is a circuit to supply the first constant current I1 again to the bit line BL and includes transistors 716, 717. The transistor 716 is a current source transistor to generate the first constant current I1 from the power supply voltage Vdd to flow. The transistor 717 switches between applying the first constant current I1 generated by the transistor 716 to the bit line BL and not applying and switches on/off according to the signal /PR2H inputted to its gate. In this example, the transistor 717 transitions to the ON state when the signal /PR2H goes low and transitions to the OFF state when the signal /PR2H goes high.

The constant current source 713 is a circuit to supply the second constant current I2 to the bit line BL and includes transistors 718, 719. The transistor 718 is a current source transistor to generate the second constant current I2 from the power supply voltage Vdd to flow. The transistor 719 switches between applying the second constant current I2 generated by the transistor 716 to the bit line BL and not applying and switches on/off according to the signal /PR2L inputted to its gate. In this example, the transistor 719 transitions to the ON state when the signal /PR2L goes low and transitions to the OFF state when the signal /PR2L goes high.

The operational amplifier 720 outputs the result of comparing the voltage on the bit line BL and a reference voltage. In this example, the voltage on the bit line BL is inputted to the positive input side (non-inverting amplification terminal) of the operational amplifier 720, and the reference voltage is inputted to the negative input side (inverting amplification terminal). The output OUT of the operational amplifier 720 is inputted to the AND circuit 730 via the latch/selection circuit 740. The OE is also inputted to the AND circuit 730.

The latch/selection circuit 740 latches the output OUT of the operational amplifier 720 and selects the next reference voltage and the next constant current according to the output OUT. The specific configuration will be described later.

The reference voltage supply unit 750 supplies a reference voltage to the negative input side (inverting amplification terminal) of the operational amplifier 720 and includes switching elements (complementary switches) 751, 752, 753. The switching element 751 corresponds to the switching element 451 shown in FIG. 7; the switching element 752 corresponds to the switching element 452 shown in FIG. 7; and the switching element 753 corresponds to the switching element 453 shown in FIG. 7. Detailed description is omitted from here.

Figure 34:
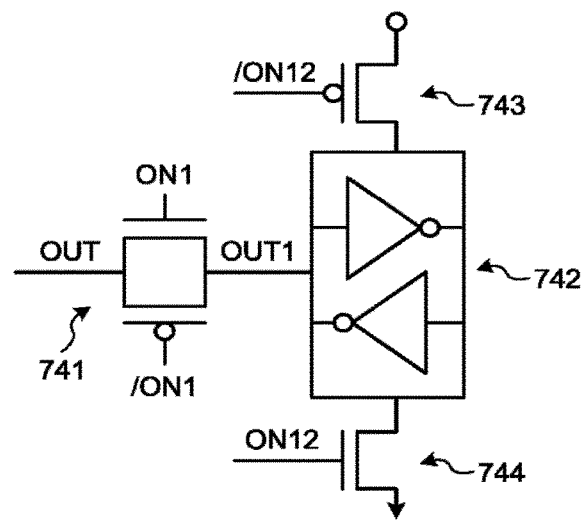
FIG. 34 is a diagram illustrating the configuration of a latch/selection circuit of the fifth embodiment.

Next, the configuration of the latch/selection circuit 740 will be described with reference to FIGS. 34 and 35. FIG. 34 is a diagram illustrating an example configuration of a circuit for providing the function of latching the above-mentioned output OUT from the operational amplifier 720 from among the functions of the latch/selection circuit 740. As shown in FIG. 34, the latch/selection circuit 740 comprises a switching element 741 and a latch circuit 742. The switching element 741 switches between supplying the output OUT from the operational amplifier 720 to the latch circuit 742 and not supplying. The switching element 741 switches on/off according to the signal ON1. In this example, the switching element 741 transitions to the ON state when the signal ON1 goes high and transitions to the OFF state when the signal ON1 goes low. Note that the signal level (H/L) of the signal ON1 is controlled by the read unit 400. In other words, the read unit 400 also has the function of controlling the signal level of the signal ON1.

The latch circuit 742 latches the output OUT1 (the output from the operational amplifier 720) inputted via the switching element 741 having transitioned to the ON state. The latch circuit 742 comprises transistors 743, 744 to switch between outputting the latched signal and not outputting. The signal levels of the signal /ON12 inputted to the gate of the transistor 743 and of the signal ON12 inputted to the gate of the transistor 744 are controlled by the read unit 400.

Figure 35:
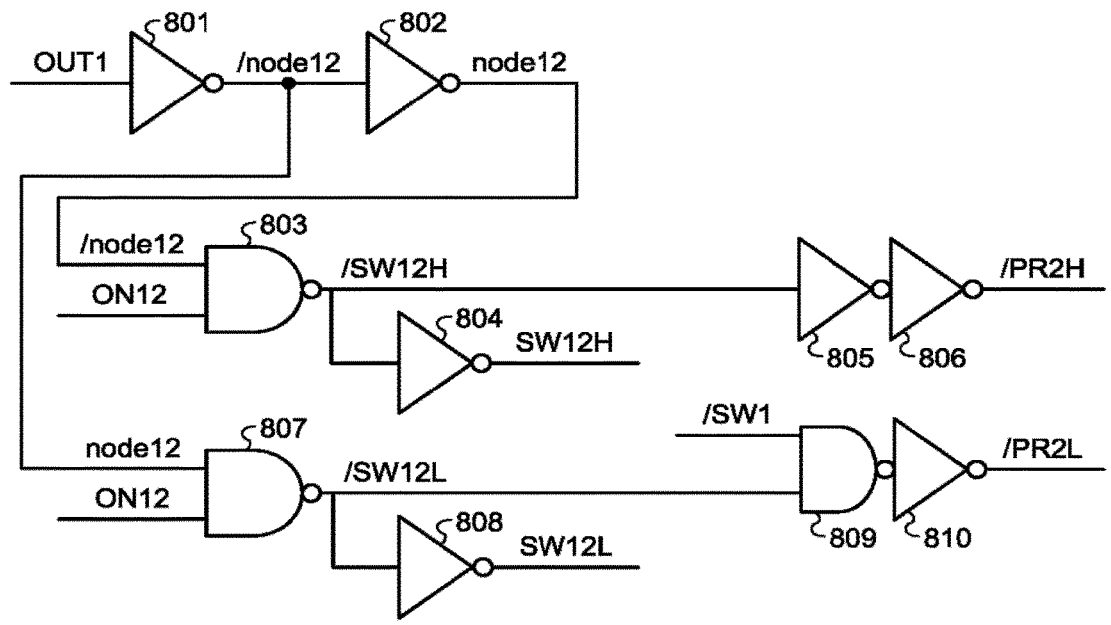
FIG. 35 is a diagram illustrating the configuration of the latch/selection circuit of the fifth embodiment.

FIG. 35 is a diagram illustrating an example configuration of a selection circuit for providing the function of selecting a constant current and a reference voltage from among the functions of the latch/selection circuit 740. Ac shown in FIG. 35, the selection circuit of the latch/selection circuit 740 comprises an inverter 801, an inverter 802, a NAND circuit 803, an inverter 804, an inverter 805, an inverter 806, a NAND circuit 807, an inverter 808, a NAND circuit 809, and an inverter 810.

The above-mentioned output OUT1 from the operational amplifier 720 through the switching element 741 is inputted to the inverter 801. A signal /node12 generated by the inverter 801 inverting the OUT1 is inputted to the inverter 802 and to the NAND circuit 807. The signal ON12 is also inputted to the NAND circuit 807, and when the signal ON12 is high and the signal /node12 is high, a signal /SW12L outputted from the NAND circuit 807 is low, and otherwise the signal /SW12L is high. The signal /SW12L is inputted to the inverter 808. The signal /SW12L is inverted by the inverter 800 and outputted as a signal SW12L. Also, the signal /SW12L is inputted to the NAND circuit 809. The signal /SW1 is also inputted to the NAND circuit 809, and when the signal /SW12L is high and the signal /SW1 is high, the signal outputted from the NAND circuit 809 is low, and otherwise the signal outputted from the NAND circuit 809 is high. The signal outputted from the NAND circuit 809 is inverted by the inverter 810 and outputted as a signal /PR2L.

A signal node12 generated by the inverter 802 inverting the signal /node12 is inputted to the NAND circuit 803. The signal ON12 is also inputted to the NAND circuit 803, and when the signal ON12 is high and the signal node12 is high, a signal /SW12H outputted from the NAND circuit 803 is low, and otherwise the signal /SW12H is high. The signal /SW12H is inputted to the inverter 804. The signal /SW12H is inverted by the inverter 804 and outputted as a signal SW12H.

Also, the signal /SW12H is inputted to the inverter 805. The signal inverted by the inverter 805 is again inverted by the inverter 806 and outputted as a signal /PR2H.

For example, suppose that in the first read, when the first constant current Imax is selected as the constant current, and the first reference voltage VREF1 is selected as the reference voltage, the output OUT of the operational amplifier 720 is low. That is, suppose that the first reference voltage VREF1 is higher than the voltage on the bit line BL. In this case, with the circuits of FIGS. 34 and 35, the signal SW12L is high and the signal SW12H is low, so that the first reference voltage VREF1 is selected as the reference voltage. At this time, the signal /PR2L is low and the signal /PR2H is high, so that the second constant current I2 is selected as the constant current.

In contrast, for example, suppose that the output OUT of the operational amplifier 720 is high, that is, the first reference voltage VREF1 is lower than the voltage on the bit line BL. In this case, with the circuits of FIGS. 34 and 35, the signal SW12L is low and the signal SW12H is high, so that the second reference voltage VREF2H is selected as the reference voltage. At this time, the signal /PR2L is high and the signal /PR2H is low, so that the first constant current Imax is supplied as the constant current.

FIG. 36 is a diagram illustrating an example timing chart when the read unit 400 controls various signals to select a reference voltage and a constant current in reading data from the selected storage element 101. In this example, the premise is that the bit line BL connected to the storage element 101 to be selected is already selected.

As shown in FIG. 36, first, the read unit 400 selects the word line WL and controls the signal SW1 to be high and the signal /PR1 to be low. Thus, the transistor 715 and the switching element 751 transition to the ON state, so that the first constant current Imax is supplied as the constant current to be applied to the bit line BL connected to the storage element 101 selected and that the first reference voltage VREF1 is selected as the reference voltage to be inputted to the negative input side (inverting amplification terminal) of the operational amplifier 720. The voltage on the bit line BL is determined as the voltage at which the discharge amount depending on the resistance state of the storage element 101 and the supplied first constant current I1 are in balance. FIG. 36 shows the voltage on the bit line BL for each of the resistance states (1, 1), (1, 0), (0, 1), (0, 0) of the storage element 101.

Then the read unit 400 controls the signal ON1 to be high for a predetermined period while outputting the comparing result of the operational amplifier 720. By this means, the switching element 741 transitions to the ON state, so that the output OUT1 of the operational amplifier 720 is inputted to the latch circuit 742.

As above, if the output OUT of the operational amplifier 720 is low, the signal SW12L is high, and the signal SW12H is low, so that the first reference voltage VREF1 is selected as the reference voltage. At this time, the signal /PR2L is low and the signal /PR2H is high, so that the second constant current I2 is selected as the constant current. In this case, the voltage on the bit line BL changes to the voltage at which the discharge amount depending on the resistance state of the storage element 101 and the supplied second constant current I2 are in balance. If the output OUT of the operational amplifier 720 is high, the signal SW12L is low, and the signal SW12H is high, so that the second reference voltage VREF2H is selected as the reference voltage. At this time, the signal /PR2L is high and the signal /PR2H is low, so that the first constant current Imax is selected as the constant current. In this case, the voltage on the bit line BL is determined as the voltage at which the discharge amount depending on the resistance state of the storage element 101 and the supplied constant current I1 are in balance.

Then the read unit 400 determines the resistance value of the storage element 101 according to the comparing result of the operational amplifier 720.

What is claimed is:

1. A resistance change memory device comprising:
    a memory cell array in which a plurality of resistance change storage elements each to store one of multiple resistance states as data represented in two or more bits are arranged; and
    a read unit to read the data of a selected one of the storage elements,
    wherein in reading the data of the storage element, the read unit, selecting one at a time, applies multiple types of constant voltages to the storage element, and
    wherein the read unit selects a constant voltage so as to read avoiding a forbidden region that is a set of phase transition points indicating operation points at which a phase transition occurs in the storage element.

2. The resistance change memory device according to claim 1, wherein while sequentially selecting one of a plurality of reference voltages corresponding to a plurality of threshold resistances to determine which of the multiple resistance states the data of the storage element is, the read unit selects a next reference voltage and a next constant voltage to read, according to a result of comparing a first reference voltage that is a reference voltage selected first and a voltage when reading after applying a first constant voltage that is a constant voltage selected first to a bit line for supplying a voltage to the storage element.

3. The resistance change memory device according to claim 2, wherein the first constant voltage selected first is a maximum voltage at which to be able to avoid the forbidden region, and an intersection of the maximum voltage and a maximum current at which to be able to avoid the forbidden region corresponds to a middle threshold resistance from among the plurality of threshold resistances.

4. The resistance change memory device according to claim 3, wherein if the voltage on the bit line when reading after applying the first constant voltage exceeds the first reference voltage, the read unit selects a second reference voltage, higher than the first reference voltage, as a reference voltage corresponding to a threshold resistance higher by one step than the middle threshold resistance and selects a second constant voltage, higher than the first constant voltage, as a constant voltage so as to read, and
    wherein setting is made such that operation points of the storage element when reading after applying the first constant voltage and the second constant voltage to the bit line avoid the forbidden region.

5. The resistance change memory device according to claim 4, wherein if the voltage on the bit line when reading after applying a kth constant voltage (k≥3) exceeds a kth reference voltage, the read unit selects a k'th reference voltage, higher than the kth reference voltage, as a reference voltage corresponding to a threshold resistance higher by one step or more than the middle threshold resistance and selects a k'th constant voltage, higher than the kth constant voltage, as a constant voltage so as to read, and
    wherein setting is made such that operation points of the storage element when reading after applying the kth and k'th constant voltages to the bit line avoid the forbidden region.

6. The resistance change memory device according to claim 4, wherein after applying the first constant voltage and reading, on the way to reading after applying the second constant voltage, the read unit temporarily renders the storage element non-selected and then selects and, while the storage element is non-selected, precharges the bit line to the second constant voltage.

7. The resistance change memory device according to claim 3, wherein if the voltage on the bit line when reading after applying the first constant voltage is smaller than the first reference voltage, the read unit selects a third reference voltage, smaller than the first reference voltage, as a reference voltage corresponding to a threshold resistance lower by one step than the middle threshold resistance and again selects the first constant voltage as a constant voltage so as to read, and
    wherein setting is made such that operation points of the storage element when reading after applying the first constant voltage to the bit line avoid the forbidden region.

8. The resistance change memory device according to claim 7, wherein if the voltage on the bit line when reading after applying the first constant voltage is smaller than the first reference voltage, the read unit selects a k"th reference voltage, smaller than the kth reference voltage, as a reference voltage corresponding to a threshold resistance higher by one step or more than the kth threshold resistance (k≥3) and again selects the first constant voltage as a constant voltage so as to read, and
    wherein setting is made such that operation points of the storage element when reading after applying the kth constant voltage to the bit line avoid the forbidden region.

9. The resistance change memory device according to claim 7, wherein after applying the first constant voltage and reading, on the way to reading after again applying the first constant voltage, the read unit temporarily renders the storage element non-selected and then selects and, while the storage element is non-selected, again precharges the bit line to the first constant voltage.

10. The resistance change memory device according to claim 4, wherein if the voltage on the bit line when reading after applying the first constant voltage is smaller than the first reference voltage, the read unit selects a third reference voltage, lower than the first reference voltage, as a reference voltage corresponding to a threshold resistance lower by one step than the middle threshold resistance and does not again select the first constant voltage nor select another constant voltage, so as to perform a second read, and
    wherein setting is made such that operation points of the storage element when reading after applying the first constant voltage to the bit line avoid the forbidden region.

11. A resistance change memory device comprising:
    a memory cell array in which a plurality of resistance change storage elements each to store one of multiple resistance states as data represented in two or more bits are arranged; and
    a read unit to read the data of a selected one of the storage elements,
    wherein the read unit reads the data of the storage element while switching between a constant voltage read method which applies a constant voltage to read the data of the storage element and a constant current read method which applies a constant current to read the data of the storage element.

12. The resistance change memory device according to claim 11, wherein the read unit switches from the constant voltage read method to the constant current read method to read the data of the storage element.

13. The resistance change memory device according to claim 12, wherein the read unit first selects a first reference voltage corresponding to a middle threshold resistance of a plurality of threshold resistances to determine which of the multiple resistance states the data of the storage element is, and a first constant voltage, and wherein if a voltage on a bit line, for supplying a voltage to the storage element, when reading after applying the first constant voltage exceeds the first reference voltage, the read unit selects a second reference voltage, higher than the first reference voltage, as a reference voltage corresponding to a threshold resistance higher by one step than the middle threshold resistance and applies, as a constant current, a maximum current that is a maximum current outside a forbidden region that is a set of phase transition points indicating operation points at which a phase transition occurs in the storage element so as to read, and wherein setting is made such that an operation point of the storage element when reading while applying the maximum current avoids the forbidden region.

14. The resistance change memory device according to claim 13, wherein if the voltage on the bit line when reading after applying the first constant voltage is smaller than the first reference voltage, the read unit selects a third reference voltage, smaller than the first reference voltage, as a reference voltage corresponding to a threshold resistance lower by one step than the middle threshold resistance and again selects the first constant voltage as a constant voltage so as to read and wherein setting is made such that operation points of the storage element when reading after applying the first constant voltage to the bit line avoid the forbidden region.

15. The resistance change memory device according to claim 13, wherein if the voltage on the bit line when reading after applying the first constant voltage is smaller than the first reference voltage, the read unit selects a third reference voltage, smaller than the first reference voltage, as a reference voltage corresponding to a threshold resistance lower by one step than the middle threshold resistance and, subsequently without selecting another constant voltage, performs a second read, and wherein setting is made such that operation points of the storage element when reading after applying the first constant voltage to the bit line avoid the forbidden region.

16. A resistance change memory device comprising:
a memory cell array in which a plurality of resistance change storage elements each to store one of multiple resistance states as data represented in two or more bits are arranged; and
a read unit to read the data of a selected one of the storage elements,
wherein in reading the data of the storage element, the read unit, selecting one at a time, applies multiple types of constant currents to the storage element,
wherein the read unit first selects a first reference voltage corresponding to a middle threshold resistance of a plurality of threshold resistances to determine which of the multiple resistance states the data of the storage element is, and a first constant current,
wherein if a voltage on a bit line, for supplying a voltage to the storage element, when reading while applying the first constant current exceeds the first reference voltage, the read unit selects a second reference voltage, higher than the first reference voltage, as a reference voltage corresponding to a threshold resistance higher by one step than the middle threshold resistance and still applies the first constant current so as to read, and
wherein setting is made such that an operation point of the storage element when reading while applying the first constant current avoids a forbidden region.

17. The resistance change memory device according to claim 16, wherein if the voltage on the bit line when reading while applying the first constant current is smaller than the first reference voltage, the read unit selects the first reference voltage and selects a second constant current greater than the first constant current as a constant current so as to read, and wherein setting is made such that the operation point of the storage element when reading while applying the second constant current avoids the forbidden region.

18. The resistance change memory device according to claim 16, wherein the first constant current is a maximum current among currents outside the forbidden region.

* * * * *